(12) United States Patent
Io

(10) Patent No.: US 8,058,680 B2
(45) Date of Patent: Nov. 15, 2011

(54) NONVOLATILE SEMICONDUCTOR MEMORY WITH ERASE GATE AND ITS MANUFACTURING METHOD

(75) Inventor: Eiji Io, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 229 days.

(21) Appl. No.: 12/314,977

(22) Filed: Dec. 19, 2008

(65) Prior Publication Data
US 2009/0166708 A1 Jul. 2, 2009

(30) Foreign Application Priority Data
Dec. 27, 2007 (JP) ................................. 2007-338124

(51) Int. Cl.
*H01L 29/423* (2006.01)
(52) U.S. Cl. . 257/319; 257/315; 257/316; 257/E29.129; 257/E29.3
(58) Field of Classification Search .................. 257/315, 257/316, 319, E29.129, E29.3
See application file for complete search history.

(56) References Cited

U.S. PATENT DOCUMENTS

| 7,718,488 B2* | 5/2010 | Chen et al. | 438/257 |
| 2004/0065917 A1* | 4/2004 | Fan et al. | 257/315 |
| 2005/0207225 A1* | 9/2005 | Chen et al. | 365/185.17 |
| 2005/0275002 A1* | 12/2005 | Shone | 257/296 |
| 2006/0068529 A1* | 3/2006 | Chen et al. | 438/142 |
| 2007/0166903 A1* | 7/2007 | Lojek | 438/197 |
| 2008/0017917 A1* | 1/2008 | Lin et al. | 257/321 |
| 2009/0039410 A1* | 2/2009 | Liu et al. | 257/320 |

FOREIGN PATENT DOCUMENTS

| JP | 2000-286348 | 10/2000 |
| JP | 2001-230330 | 8/2001 |

* cited by examiner

*Primary Examiner* — Victor A Mandala
(74) *Attorney, Agent, or Firm* — McGinn IP Law Group, PLLC

(57) ABSTRACT

A nonvolatile semiconductor memory device includes a semiconductor substrate, a select gate formed above the semiconductor substrate, a floating gate formed above the semiconductor substrate and an erase gate positioned lower than an upper surface of the floating gate, and opposite an edge of a lower surface of the floating gate.

22 Claims, 27 Drawing Sheets

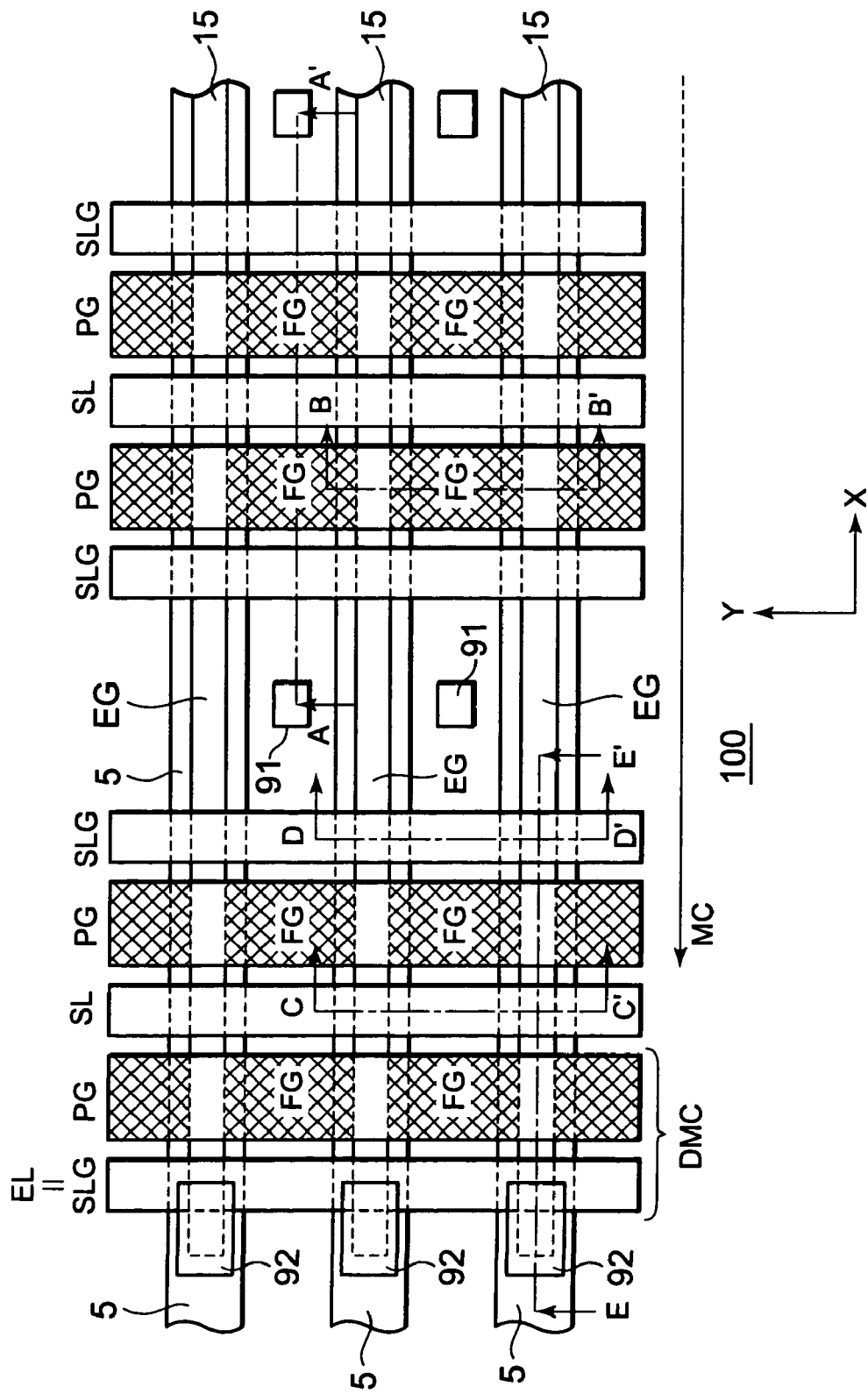

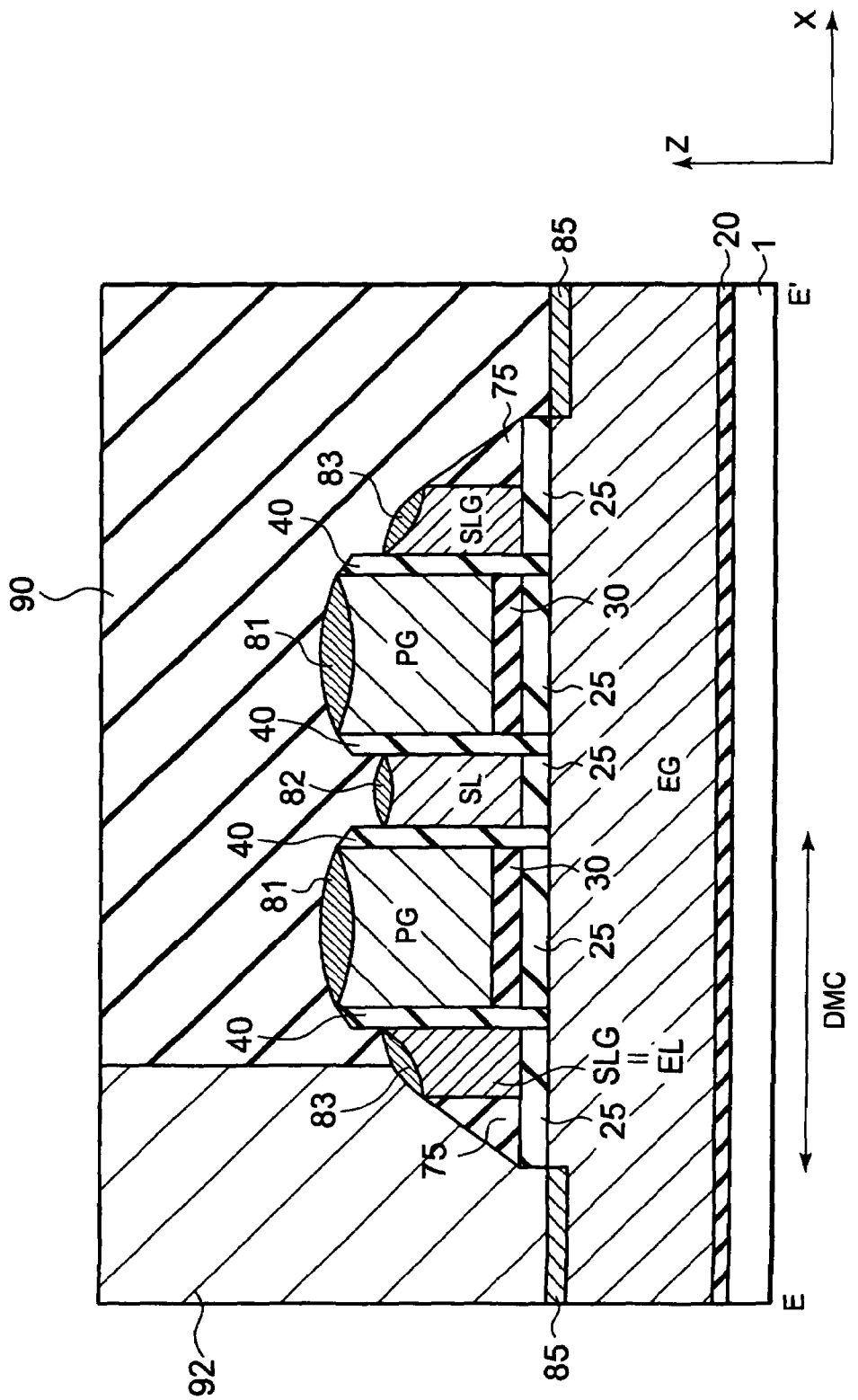

PROGRAM

ERASE

NONVOLATILE SEMICONDUCTOR MEMORY WITH ERASE GATE AND ITS MANUFACTURING METHOD

BACKGROUND OF THE INVENTION

1. Field of the Invention

The present invention relates to a nonvolatile semiconductor memory containing an erase gate, and to a manufacturing method for the nonvolatile semiconductor memory containing the erase gate.

2. Description of Related Art

A memory device such as a flash memory and an electrically erasable programmable read-only memory (EEPROM) is a nonvolatile semiconductor device capable of being electrically erased and programmed. A memory cell in this type of nonvolatile semiconductor device is usually a transistor containing a floating gate and a control gate. The control gate is in some cases stacked on the floating gate, and in some cases formed at least on a channel region to a side of the floating gate. A type of the latter memory cell is called a "split-gate" and type memory cell, and is superior in terms of higher read speed and in controlling over-erasure.

A typical data programming/erasing method for the memory cell is as follows. Data programming is implemented by the Channel Hot Electron (CHE) method. More specifically, a specified program voltage potential is applied to the respective control gate and drain, and hot electrons emitted in the vicinity of the drain are injected into the floating gate. Data erasure however is implemented by the Fowler-Nordheim (FN) tunneling method. More specifically, a high voltage potential is applied to the control gate, and electrons within the floating gate are extracted via the tunnel insulation film to the control gate by FN tunneling.

Here, the following problem is encountered. The control gate in the above-described split-gate type memory cell is formed on the channel region via a gate insulation film. Moreover, to achieve FN tunneling during data erasure, a high voltage potential must be applied to the control gate as described above. The gate insulation film directly below the control gate where the high-voltage potential is applied, cannot be thinned (i.e., reduced in thickness) due to the need for reliability. Failing to thin the gate insulation film between the channel region and the control gate causes problems of a reduced read current during data read, and a drop in the read speed.

To resolve the aforementioned problems, a technology was disclosed (See JP-A No. 2001-230330, JP-A No. 2000-286348) for forming an "erase gate" for data erasure that is separate from the control gate. During data erasure, a high voltage potential is applied to this erase gate rather than the control gate. Consequently, FN tunneling then extracts electrons within the floating gate to the erase gate. The gate insulation film directly below the control gate can therefore be made thin because a high voltage potential no longer has to be applied to the control gate during data erasure. A drop in the read speed is therefore also prevented.

In the technology disclosed in JP-A No. 2001-230330, the erase gate is stacked via an insulation film on the floating gate, and the control gate is formed to a side of a laminated structure made up of the floating gate and the erase gate. In the technology disclosed in JP-A No. 2000-286348, the erase gate is formed on a source region of a semiconductor substrate surface, and formed so as to adjoin an entire side of the floating gate and a portion of an upper surface of the floating gate via a tunnel oxide film.

SUMMARY OF THE INVENTION

However, the present inventor has recognized the following point. Namely, forming the control gate separately from the erase gate as described in the above literature prevents a drop in the read speed. However, coupling capacitance between this type of erase gate and floating gate acts to impede high-speed erase operation. In other words, the erasure speed cannot be improved while on the other hand preventing a drop in the read speed.

The present invention seeks to solve one or more of the above problems, or to improve upon those problems at least in part.

In one exemplary embodiment, a nonvolatile semiconductor memory device according to the present invention includes a semiconductor substrate, a select gate formed above the semiconductor substrate, a floating gate formed above the semiconductor substrate, and an erase gate positioned lower than an upper surface of the floating gate, and opposite an edge of a lower surface of the floating gate.

In another exemplary embodiment, a nonvolatile semiconductor memory device according to the present invention includes a semiconductor substrate, a select gate formed above the semiconductor substrate, a floating gate formed above the semiconductor substrate to a side of the select gate, a device isolation structure formed on the semiconductor substrate, and an erase gate formed on the device isolation structure. The erase gate is positioned lower than an upper surface of the floating gate, and opposite an edge of a lower surface of the floating gate.

In yet another exemplary embodiment, a nonvolatile semiconductor memory device according to the present invention includes a semiconductor substrate and a memory cell array with a plurality of memory cells formed on the semiconductor substrate. Each of the plurality of memory cells includes a select gate formed above the semiconductor substrate, a floating gate formed above the semiconductor substrate, and an erase gate positioned lower than an upper surface of the floating gate, and opposite an edge of a lower surface of the floating gate. The erase gate is jointly formed with specified number of memory cells arrayed along a predetermined direction among the plurality of memory cells.

The erase gate in the present invention is formed opposite the edge of the lower surface of the floating gate and is positioned lower than the upper surface of the floating gate. Excessive capacitive coupling between the erase gate and floating gate can therefore be eliminated. Lowering the capacitive coupling between the erase gate and floating gate improves the erasure efficiency and speeds up the erasure operation. In other words, both the read speed and the erase speed are improved.

BRIEF DESCRIPTION OF THE DRAWINGS

The above and other purposes, advantages and features of the present invention will become more apparent from the following description of certain exemplary embodiments taken in conjunction with the accompanying drawings in which:

FIG. 1 is a plan view showing an overall structure of a nonvolatile semiconductor memory device of a first exemplary embodiment;

FIG. 2E is a cross sectional view showing a structure along lines E-E' in FIG. 1;

DETAILED DESCRIPTION OF THE EXEMPLARY EMBODIMENTS

Figure 2A:
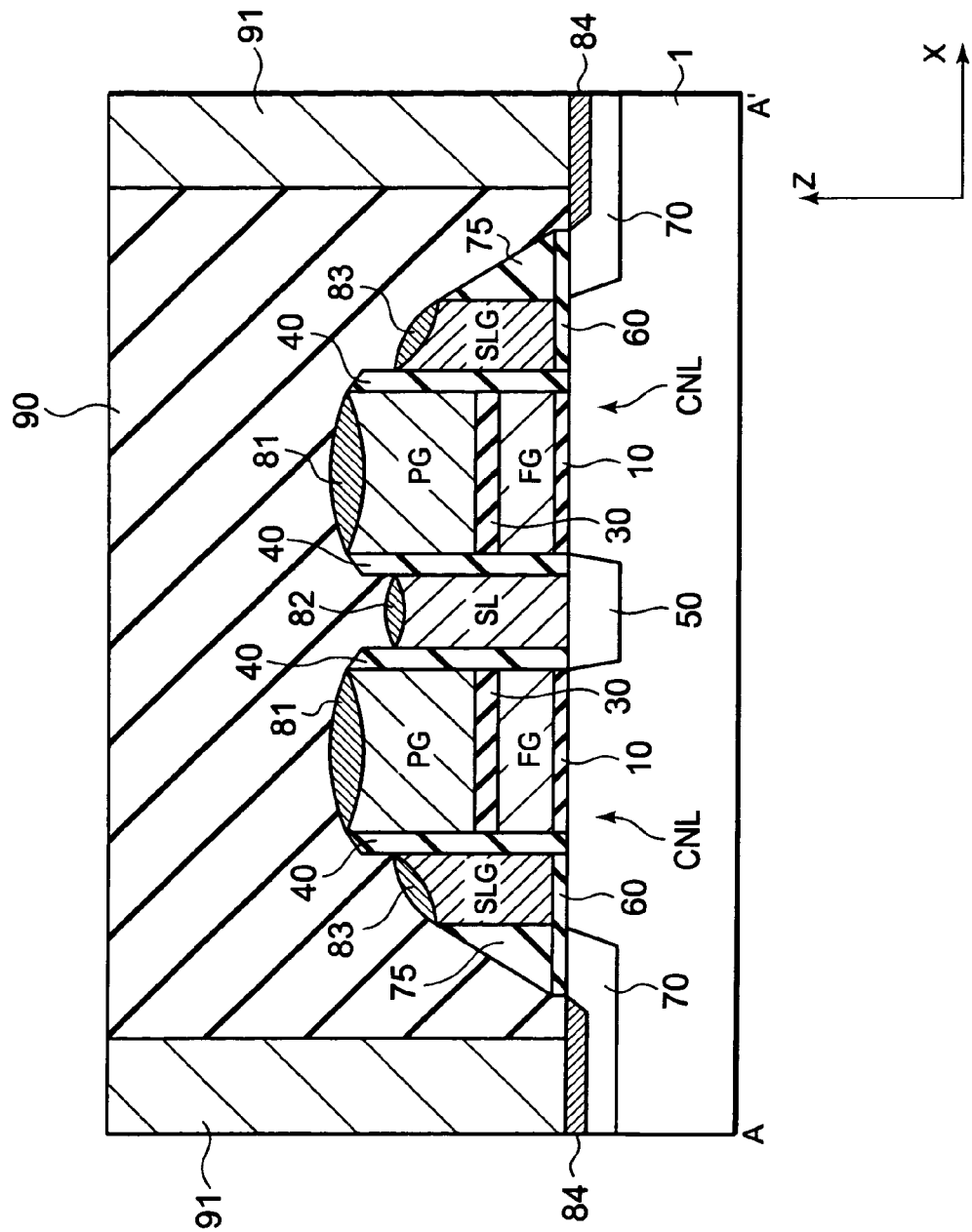
FIG. 2A is a cross sectional view showing a structure along lines A-A' in FIG. 1.

The invention will now be described herein with reference to illustrative embodiments. Those skilled in the art will recognize that many alternative embodiments can be accomplished using the knowledge of the present invention and that the invention is not limited to the exemplary embodiments illustrated for explanatory purposes.

First Exemplary Embodiment

1. Structure

FIG. 1 is a plan view showing an overall structure of a nonvolatile semiconductor memory device of the first exemplary embodiment of this invention. FIG. 1 shows an approximate placement and extension direction of each gate, and an upper wiring layer is omitted from the drawing. The nonvolatile semiconductor memory device of the first exemplary embodiment includes a memory cell array 100 made up of multiple memory cells MC formed in arrays. Each of the memory cells MC is a field-effect transistor (FET) (memory cell transistor) containing multiple gates. More specifically, each memory cell MC contains an erase gate EG, a select gate SLG, a program gate PG, a floating gate FG, and a source line SL.

The erase gate EG is a gate for data erasure. The erase gate EG extends along the X direction as shown in FIG. 1. More specifically, the erase gate EG is formed along a device isolation structure formed to extend in the X direction. This device isolation structure may, for example, be Shallow Trench Isolation (STI) structure 5. As shown in FIG. 1, multiple STI structures 5 are formed roughly in parallel extending in the X direction. A slit-shaped trench 15 is formed along the X direction in a center of each STI structure 5. At least a portion of the erase gates EG are embedded in that trench 15. This type of erase gate EG is formed jointly with a specified number of memory cells MC formed along the X direction. A specified number of these memory cells MC make up a single erase block.

The select gate SLG is a gate utilized to select a memory cell MC. As shown in FIG. 1, the select gate SLG extends in the Y direction intersecting the X direction, and is formed jointly with a specified number of memory cells MC formed along the Y direction.

The program gate PG is a gate utilized during a data reading operation and a data programming operation. The program gate PG fulfills the task of a so-called control gate. As shown in FIG. 1, the program gate PG is formed jointly with a specified number of memory cell MC that are formed along the Y direction, and extends in the Y direction.

The source line SL connects to a diffusion region on the memory cell MC. As shown in FIG. 1, the source line SL extends in the Y direction, and is formed jointly with a specified number of memory cells MC that are formed along the Y direction.

The floating gate FG is equivalent to a data memory area (charge retaining section) within each memory cell MC, and is formed in hatched areas in FIG. 1. The adjacent floating gates FG are separated by the above-described slit-shaped trenches 15 in the Y direction. The adjacent floating gates FG are in other words separated by a slit width roughly equal to a width of the erase gate EG. As described below, these floating gates FG and erase gates EG are formed so as to self-align.

FIG. 2A shows a structure of the XZ cross section taken along lines A-A' in FIG. 1. The semiconductor substrate 1 is, for example, a silicon substrate. A first diffusion region 50 and a second diffusion region 70, serving as a source or a drain for the memory cell transistor, are formed within this semiconductor substrate. The semiconductor region enclosed by these first diffusion region 50 and second diffusion region 70 is the channel region CNL for the memory cell transistor.

The above-described source line SL (e.g., a source plug) is formed on the first diffusion region 5Q. This source line SL is formed in a plug shape and is electrically connected to the first diffusion region 50. One-bit memory cell transistors are formed respectively on both sides of this source line SL. In other words, FIG. 2A shows memory cell transistors with a 2-bit capacity that are jointly sharing the source line SL. Each of these memory cell transistors includes the floating gate FG, the program gate PG, the select gate SLG, the source line SL, the first diffusion region 50, and the second diffusion region 70.

The floating gate FG is formed via a first gate insulation film 10 on the channel region CNL within the first semiconductor substrate 1. The floating gate FG is also electrically insulated from a peripheral area. More specifically, a protective insulation film 40 is formed on the side surface of the floating gate FG, and an insulation film 30 (for example an ONO film) is formed on an upper surface of protective insulation film 40. The program gate PG is formed via insulation film 30, on the floating gate FG. A protective insulation film 40 is formed on the side surface of the program gate PG in the same way.

The select gate SLG is formed via a thin second gate insulation film 60 on the channel region CNL within the semiconductor substrate 1. The protective insulation film 40 is formed on one side surface of the select gate SLG, and a sidewall 75 is formed on the other side surface. The select gate SLG and the floating gate FG are, in other words, formed arrayed on the channel region CNL, and adjacently enclose the protective insulation film 40. In FIG. 2A, the floating gate FG is formed on the sides of the first diffusion region 50, and the select gate SLG on the other hand, is formed on the side of the second diffusion region 70.

The upper surfaces of the above described program gate PG, the source line SL, the select gate SLG, and the second diffusion region 70 are subjected to siliciding. More specifically, silicide films 81, 82, 83 and 84 are respectively formed on the upper surfaces of the program gate PG, the source line SL, the select gate SLG, and the second diffusion region 70. These silicide films 81-84 are, for example, cobalt silicide film.

Moreover, an interlayer insulation film 90 is formed so as to cover the above-described memory cell transistor. A contact 91 penetrating through the interlayer insulation film 90, is formed to electrically connect to the silicide film 84 on the second diffusion region 70. The contact 91 electrically connects to the bit line (not shown in drawing) extending in the X direction.

Figure 2B:
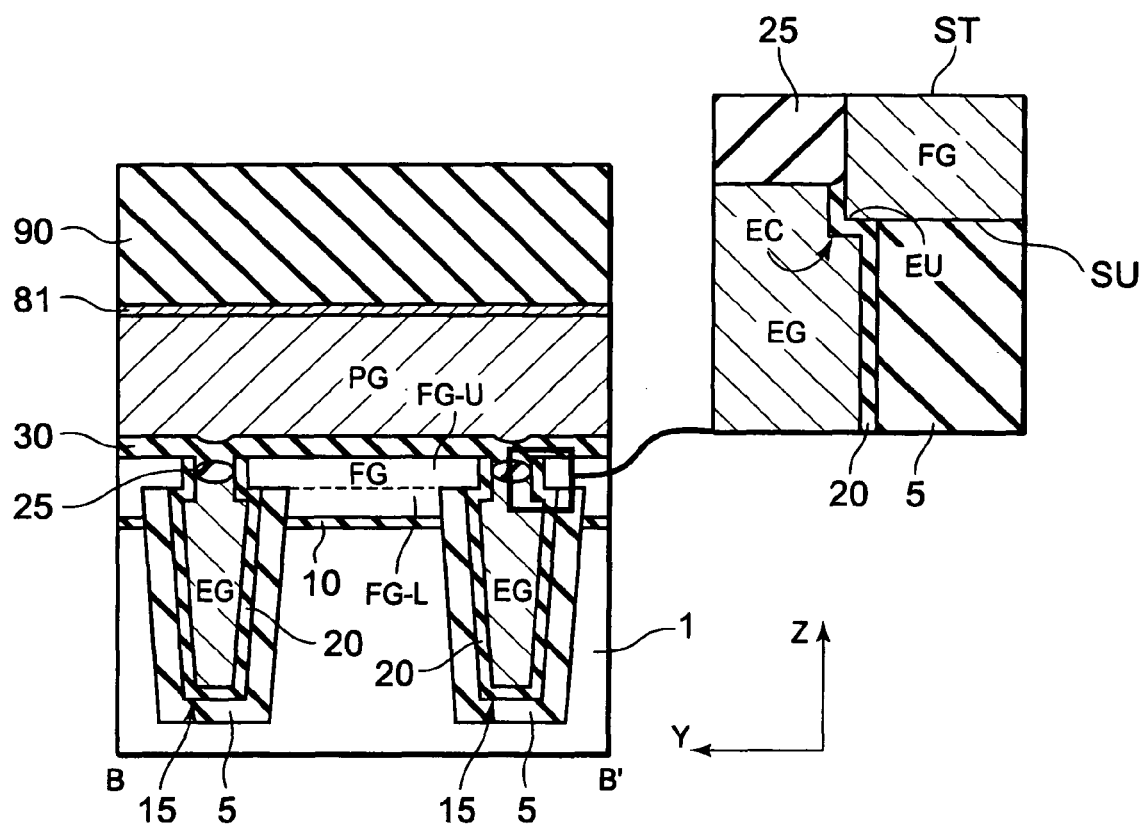
FIG. 2B is a cross sectional view showing a structure along lines B-B' in FIG. 1.

FIG. 2B shows a YZ cross sectional structure along the lines B-B' in FIG. 1. The STI structure 5 serving as the device isolation structure is formed within the semiconductor substrate 1 along the X direction as even shown previously in FIG. 1. This STI structure 5 is formed so that a portion protrudes from the surface of the semiconductor substrate 1 as shown in FIG. 2B.

The floating gate FG is formed so as to overlap a portion of this protruding STI structure 5. Stated in more detail, the floating gate FG as shown in FIG. 2B includes a lower floating gate portion FG-L enclosed by the adjoining STI structures 5, and an upper floating gate portion FG-U above the lower FG-L. The upper FG-U of the floating gate FG overlaps a portion of the STI structure 5. The floating gate FG in this way constitutes a structure with an inverted protruding cross section. Here, the "upper surface ST" and the "lower surface SU" for the floating gate FG are defined. Herein, the lower surface SU of the floating gate FG is defined as the downward facing surface opposite the semiconductor surface 1. The bottom surface of the upper FG-U is therefore also the lower surface SU of the floating gate FG. The upper surface ST of the floating gate FG on the other hand is defined as the upward facing surface on the side opposite the lower surface SU.

In the first exemplary embodiment, the erase gate EG was formed with the following characteristics in order to reduce the capacitive coupling between the floating gate FG and the erase gate EG as much as possible. Namely, the erase gate EG is positioned lower than the upper surface ST of the floating gate FG, and also formed opposite the edge EU of the lower surface SU of the floating gate FG. Stated in other words, the erase gate EG is formed "diagonally below" the floating gate FG. To position the erase gate EG below the upper surface ST of the floating gate FG, at least a portion of the erase gate EG can, for example, be embedded within the semiconductor substrate 1. In other words, at least a portion of the erase gate EG can be formed lower than the surface of the semiconductor substrate 1.

As shown in FIG. 2B for example, at least a portion of the erase gate EG can be embedded within the STI structure 5. More specifically, a slit-shaped trench 15 is formed along the X direction in the center of the STI structure 5. A tunnel insulation film 20 is formed within the wall of this trench 15. The erase gate EG is then formed on this tunnel insulation film 20 so as to be embedded within the trench 15. Also, a comparatively thick protective insulation film 25 is formed on the erase gate EG, and the above-described insulation film 30 is formed on this protective insulation film 25. In other words, an insulation film 30 is interposed between the floating gate FG and program gate PG, and an insulation film 30 and protective insulation film 25 are interposed between the program gate PG and the erase gate EG. This placement signifies that the upper surface of the erase gate EG is positioned lower than the upper surface ST of floating gate FG. The capacitive coupling between the floating gate FG and the erase gate EG is therefore reduced.

The erase gate EG is further formed to be opposite the edge EU of the lower surface SU of floating gate FG. More specifically, the erase gate EG is formed opposite (or facing) the edge EU of the lower surface SU of the upper section FG-U by way of the tunnel insulation film 20, as shown in the expanded drawing in FIG. 2B. The erase gate EG is facing the lower edge EU of floating gate FG, and there is virtually no overlap with the floating gate FG, so the capacitive coupling is reduced between the floating gate FG and the erase gate EG.

In the first exemplary embodiment, the erase gate EG is formed "diagonally below" the floating gate FG as already described, so that capacitive coupling is reduced between the floating gate FG and the erase gate EG. The erase efficiency is consequently improved, and the erase operation speed is increased as described later on.

The erase gate EG is positioned opposite (or facing) the edge EU of the floating gate FG so that the "concentrated electrical field" generated in the vicinity of the edge EU can be utilized in the erase operation described below. Utilizing this concentrated electrical field also helps improve the erase efficiency. The erase gate EG preferably contains a notch EC opposite the edge EU on the floating gate FG, as shown in the expanded drawing in FIG. 2B for the concentrated electrical field. The concentrated electrical field can be intensified and the erase efficiency can be improved by making the notch EC on the erase gate EG and the edge EU on the floating gate FG mutually face each other.

Figure 2C:
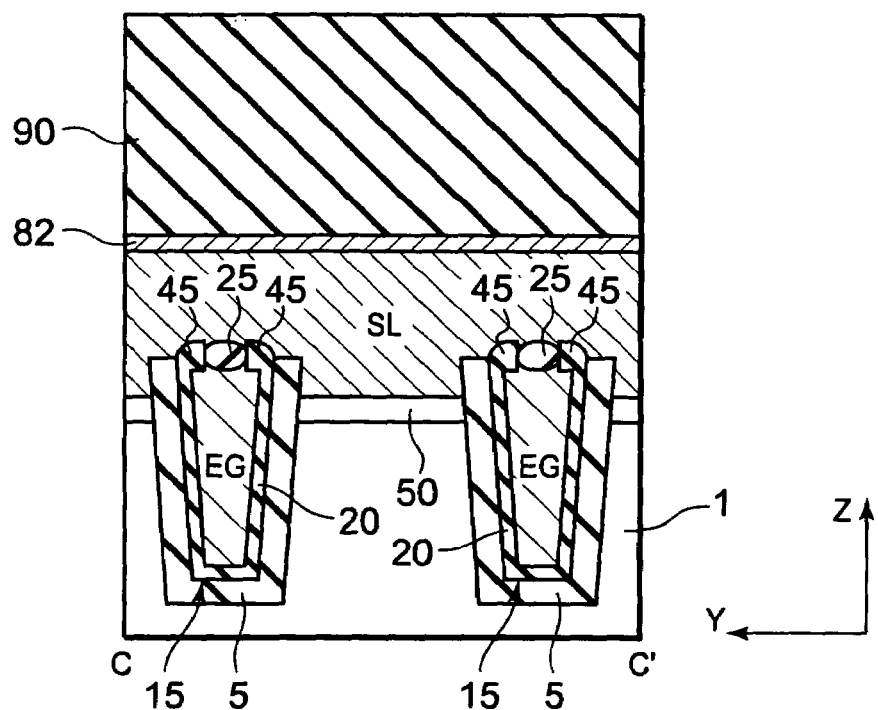
FIG. 2C is a cross sectional view showing a structure along lines C-C' in FIG. 1.

FIG. 2C shows a structure of the YZ cross section along the lines C-C' within FIG. 1. The first diffusion region 50 is formed on the surface of the semiconductor substrate 1 between the adjacent STI structures 5. The source lines SL are formed so as to join to the first diffusion region 50. The source lines SL extend in the Y direction. The upper surface of the source lines SL are silicided as already described, and form the silicide film 82. A source resistance during data read is therefore lowered as described below, and consequently the read current increases, which improves the read speed. Besides the protective insulation film 25 formed as already described between the source line SL and the erase gate EG, the protective insulation films 45 are formed on both sides of the protective insulation film 25.

Figure 2D:
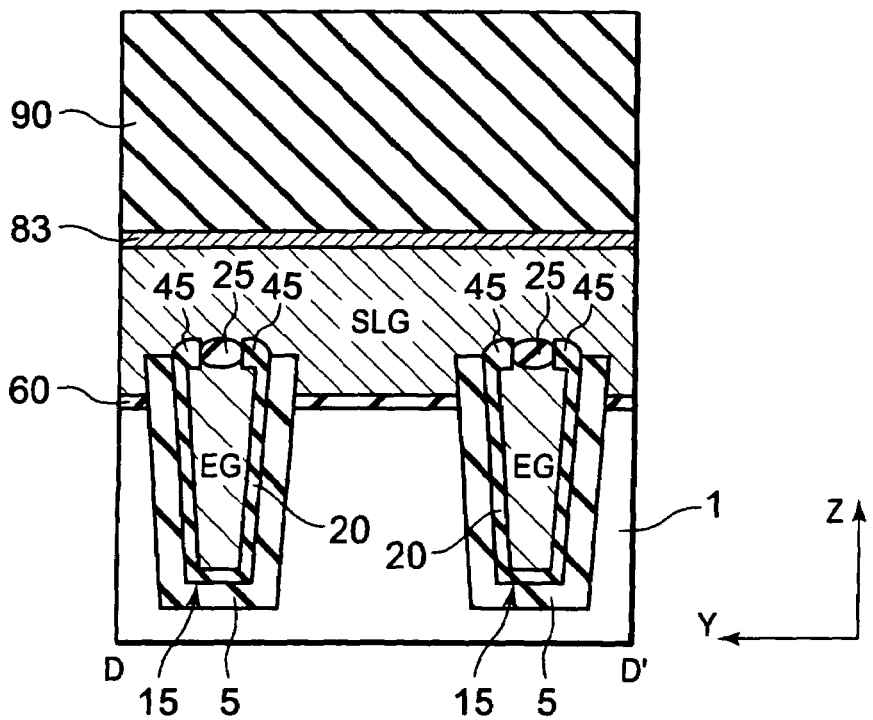
FIG. 2D is a cross sectional view showing a structure along lines D-D' in FIG. 1.

FIG. 2D shows a structure of the YZ cross section along the lines D-D' within FIG. 1. The select gate SLG is formed via the second gate insulation film 60 on the semiconductor substrate 1. The select gate SLG extends in the Y direction. The upper surface of the select gate SLG is silicided and the silicide film 83 is formed. As already described, there is no need to apply a high-voltage potential to the select gate SLG. The thin second gate insulation film 60 can therefore be formed directly below the select gate SLG. Forming a thin second gate insulation film 60 prevents a drop in the read current (read speed). Further, along with the protective insulation film 25, a protective insulation film 45 formed on both sides of the protective insulation film 25 is interposed between the select gate SLG and the erase gate EG.

FIG. 2E shows a structure of the XZ cross section taken along lines E-E' in FIG. 1. The erase gate EG extends in the X direction, and at least the protective insulation film 25 is formed between the erase gate EG and each gate. Moreover, the silicide film 85 is formed on the surface of the erase gate EG on the region where the protective insulation film 25 is not formed.

The erase gate EG is jointly formed with the specified number of memory cells MC arrayed along the X direction, as already described in FIG. 1. The specified number of memory cells make up a "single erase block". The memory cell MC positioned on the end of this single erase block functions as a "dummy cell DMC". A contact 92 is formed at the end of the single erase block, as shown in FIG. 2E, and penetrates through the interlayer insulation film 90 to electrically connect to the silicide film 85 on the erase gate EG. Contact 92 further connects to the silicide film 83 formed on the select gate SLG of the dummy cell DMC. In other words, the erase gate EG electrically connects to the select gate SLG of the dummy cell DMC by way of the contact 92. The select gate SLG of the dummy cell DMC can be said to fulfill the function of an "erase line EL" for extending the erase gate EG in the Y direction.

2. Manufacturing Method

An example of a method for manufacturing the nonvolatile semiconductor device of the first exemplary embodiment is described next. Each manufacturing process for the XY flat structure, the A-A' cross sectional structure, and the B-B' cross sectional structure are shown in FIG. 3 through FIG. 10.

Figure 3:
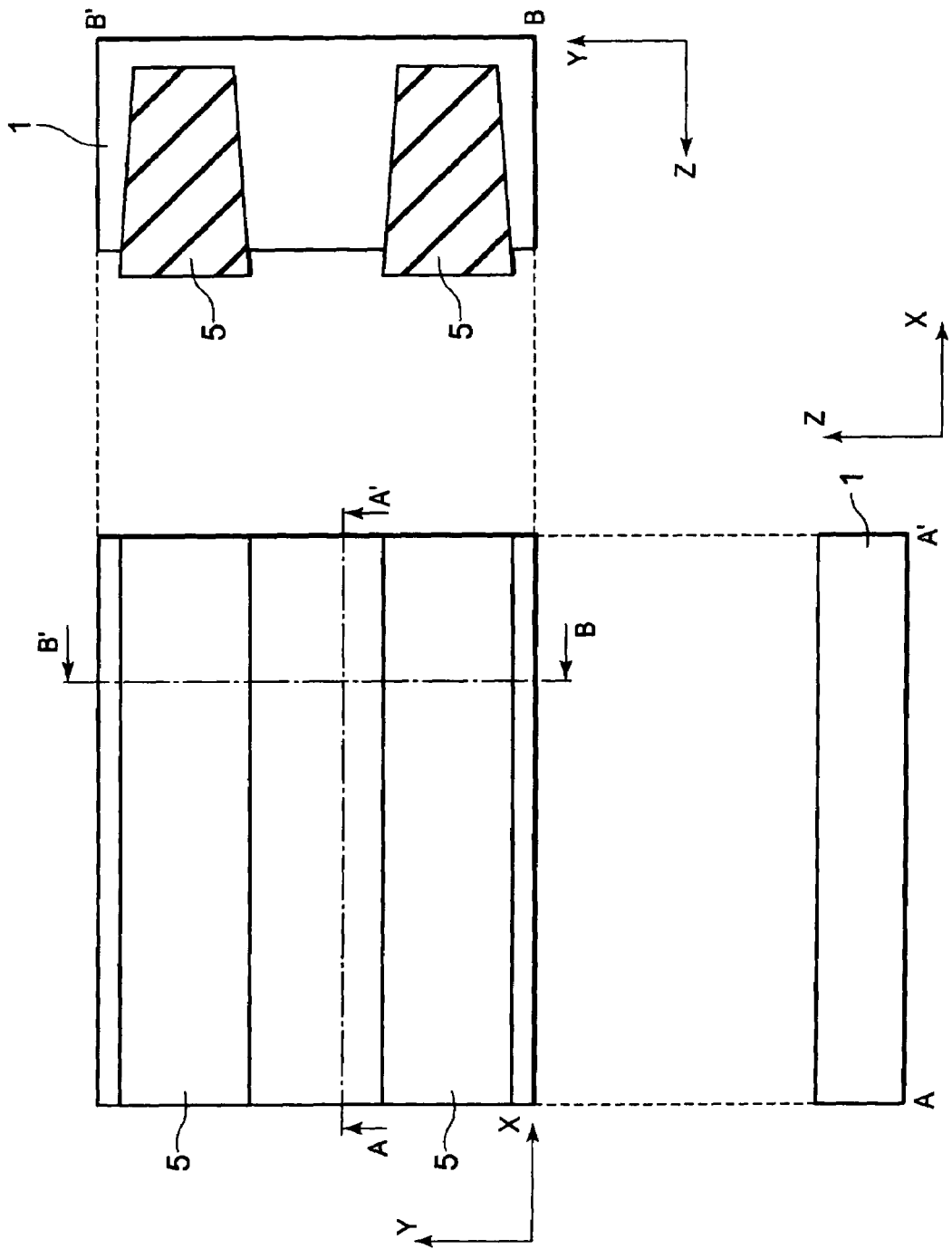
FIG. 3 shows a manufacturing process for a structure of the first exemplary embodiment.

Multiple STI structures 5, as device isolation structures, first are formed approximately in parallel along the X direction in the semiconductor substrate 1, as shown in FIG. 3. Each of the STI structures 5 is formed so as to protrude from the surface of the semiconductor substrate 1.

Figure 4:
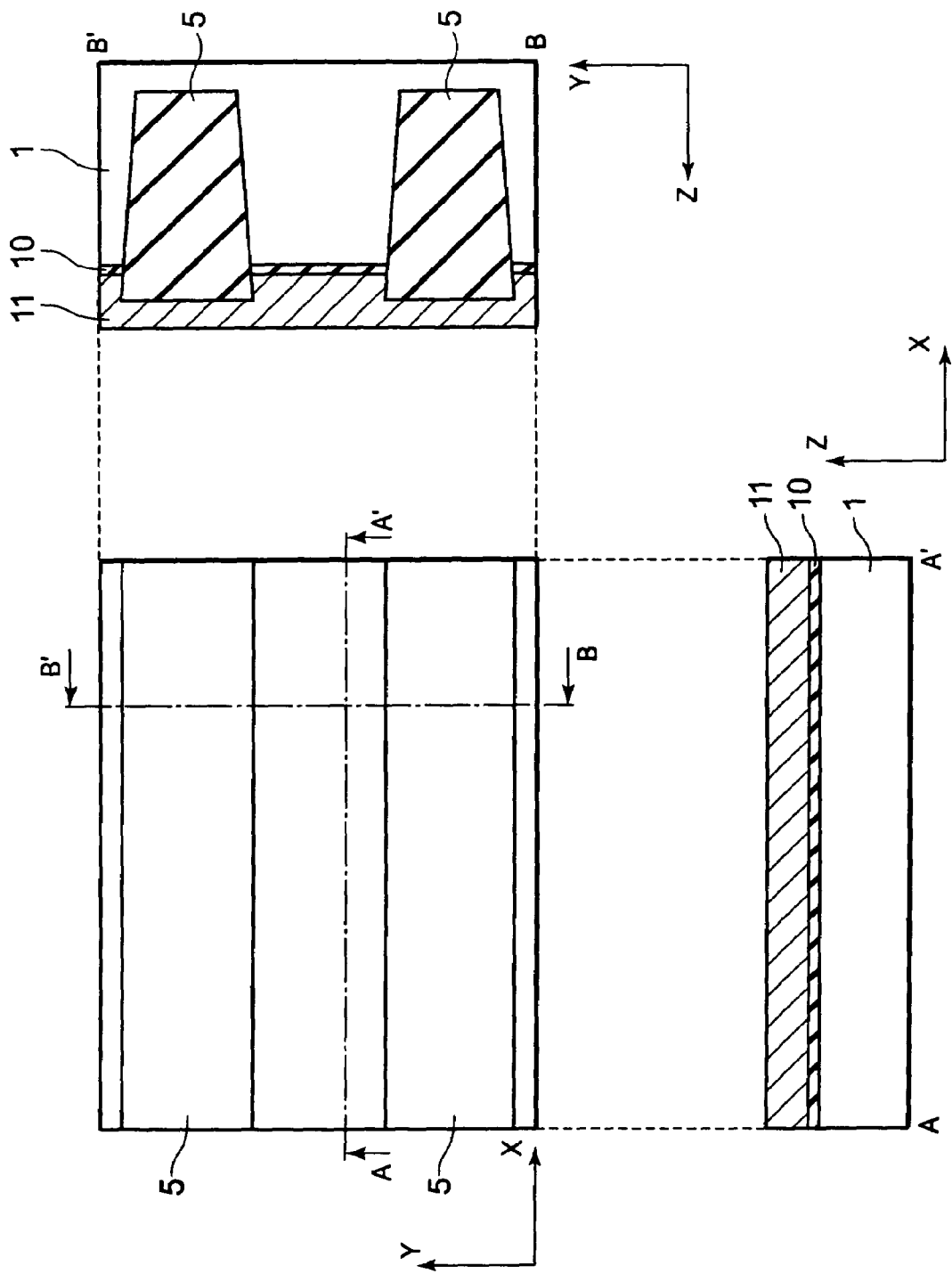
FIG. 4 shows another manufacturing process for the structure of the first exemplary embodiment.

Heat oxidizing is next performed to form the first gate insulation film 10 on the semiconductor substrate 1, as shown in FIG. 4. The FG material film 11 is next formed across the entire surface by a Chemical Vapor Deposition (CVD) method. The FG material film 11 is the material forming the film for the floating gate FG and may, for example, be silicon.

Figure 5:
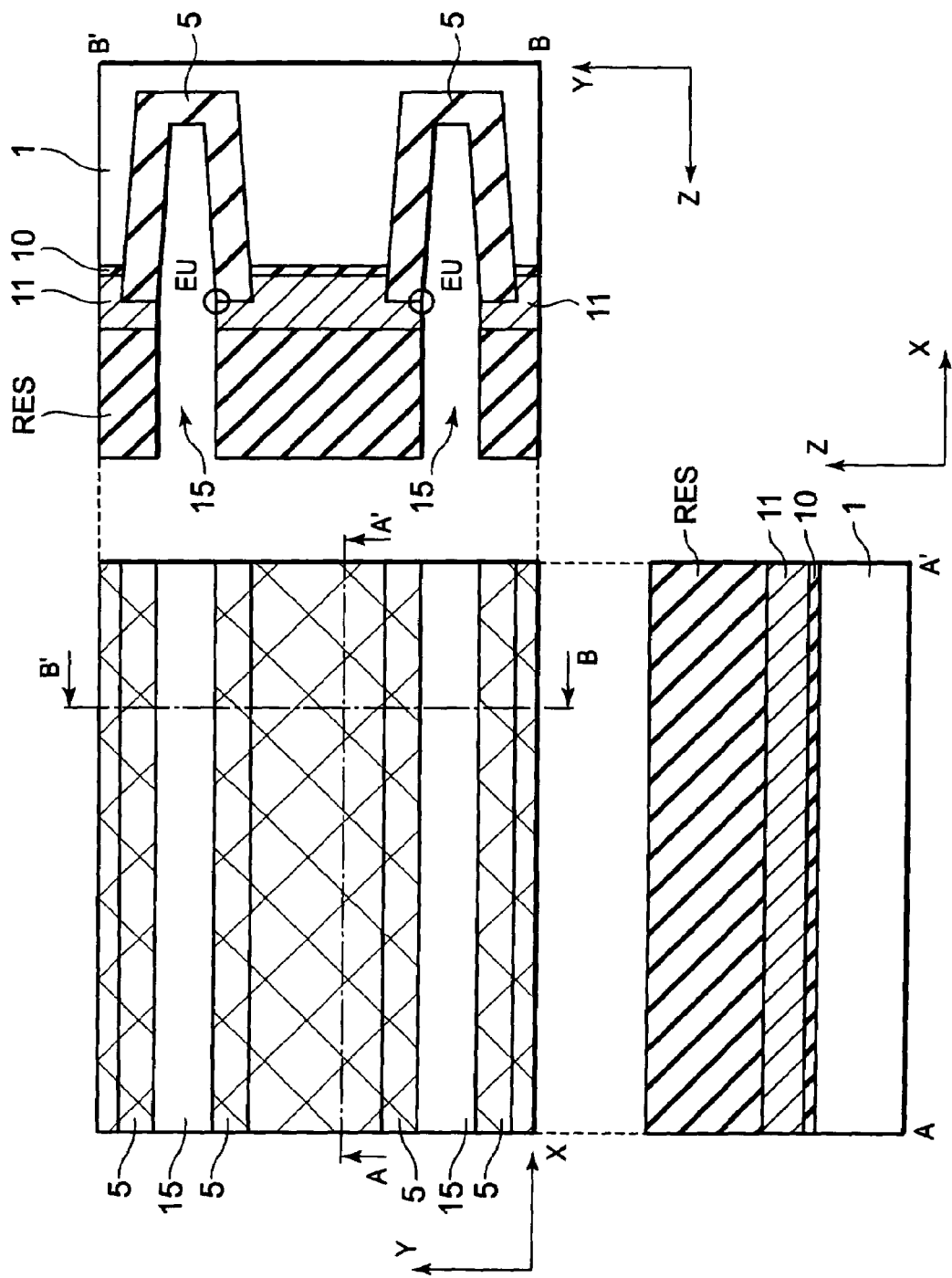
FIG. 5 shows yet another manufacturing process for the structure of the first exemplary embodiment.

As shown in FIG. 5, a resist mask RES containing a specified pattern is formed by photolithography on the FG material film 11. The resist mask RES is hatched, as shown in the plan view in FIG. 5. Resist mask RES contains a slit-shaped open pattern extending in the X direction along the center of the STI structure 5. Utilizing a resist mask RES containing this type of open pattern allows etching of a portion of the FG material film 11 and the STI structure 5. A trench 15 can therefore be formed that passes through the FG material film 11 and reaches the interior of the STI structure 5. The trench 15 is formed in a slit shape along the X direction that divides the FG material film 11 along the Y direction by way of trench 15. The trench 15 is in that respect hereinafter referred to as the "FG slit". An edge EU equivalent to the bottom edge EU of the above-described floating gate FG, is formed on the lower surface of the FG material film 11 overlapping the STI structure 5.

Figure 6:
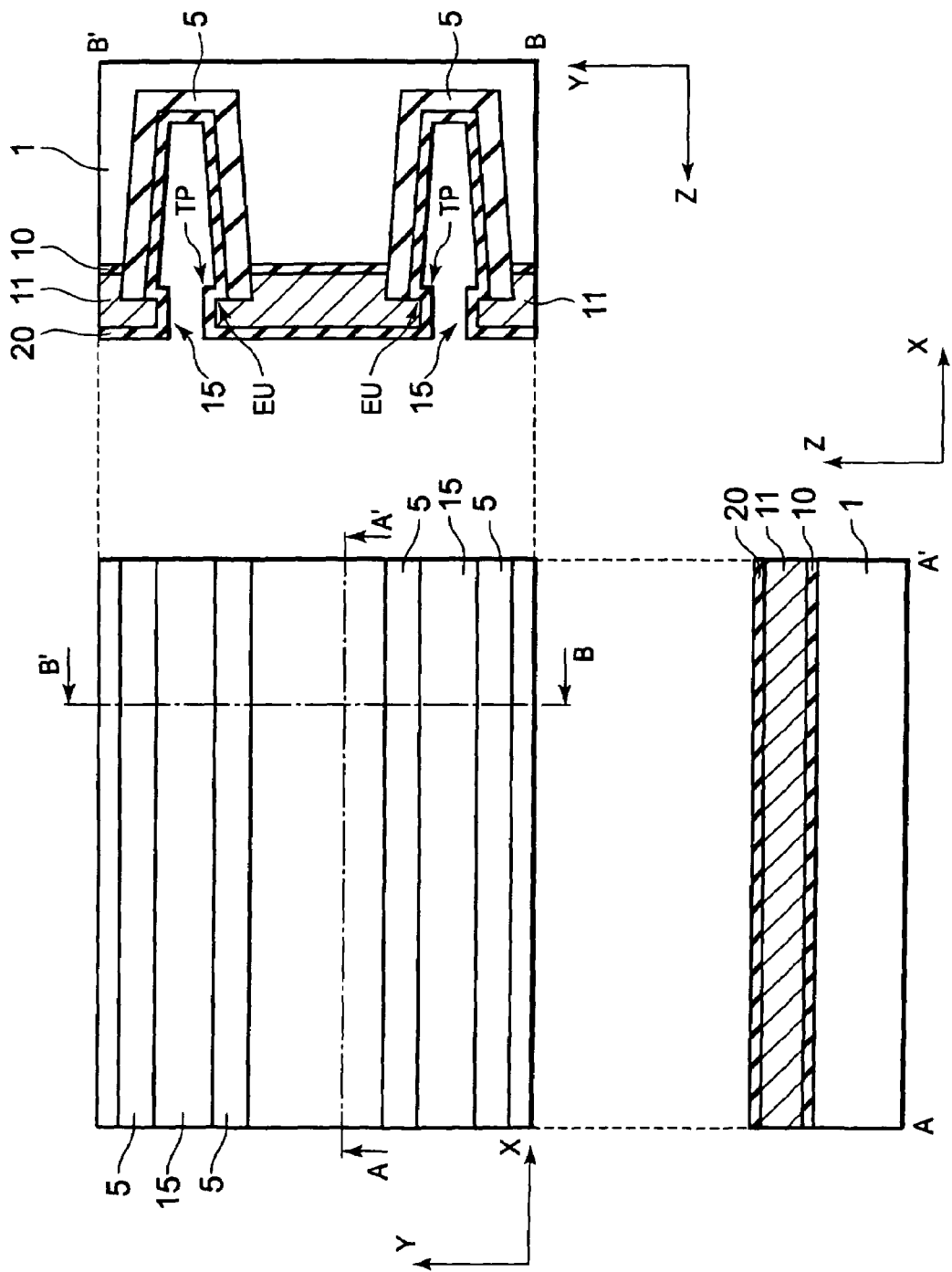
FIG. 6 shows still another manufacturing process for the structure of the first exemplary embodiment.

Wet etching is next performed after stripping away the resist mask RES. The inner wall of the STI structure 5 within the trench 15 consequently retracts slightly as shown in FIG. 6 to form the step TP. This step TP matches the cavity EC of the erase gate EG formed next. Thermal oxidizing is next implemented to form the tunnel insulation film 20 across the entire surface. There is also a step TP on the tunnel insulation film 20 formed on the inner wall of the trench 15, as shown in FIG. 6.

Figure 7:
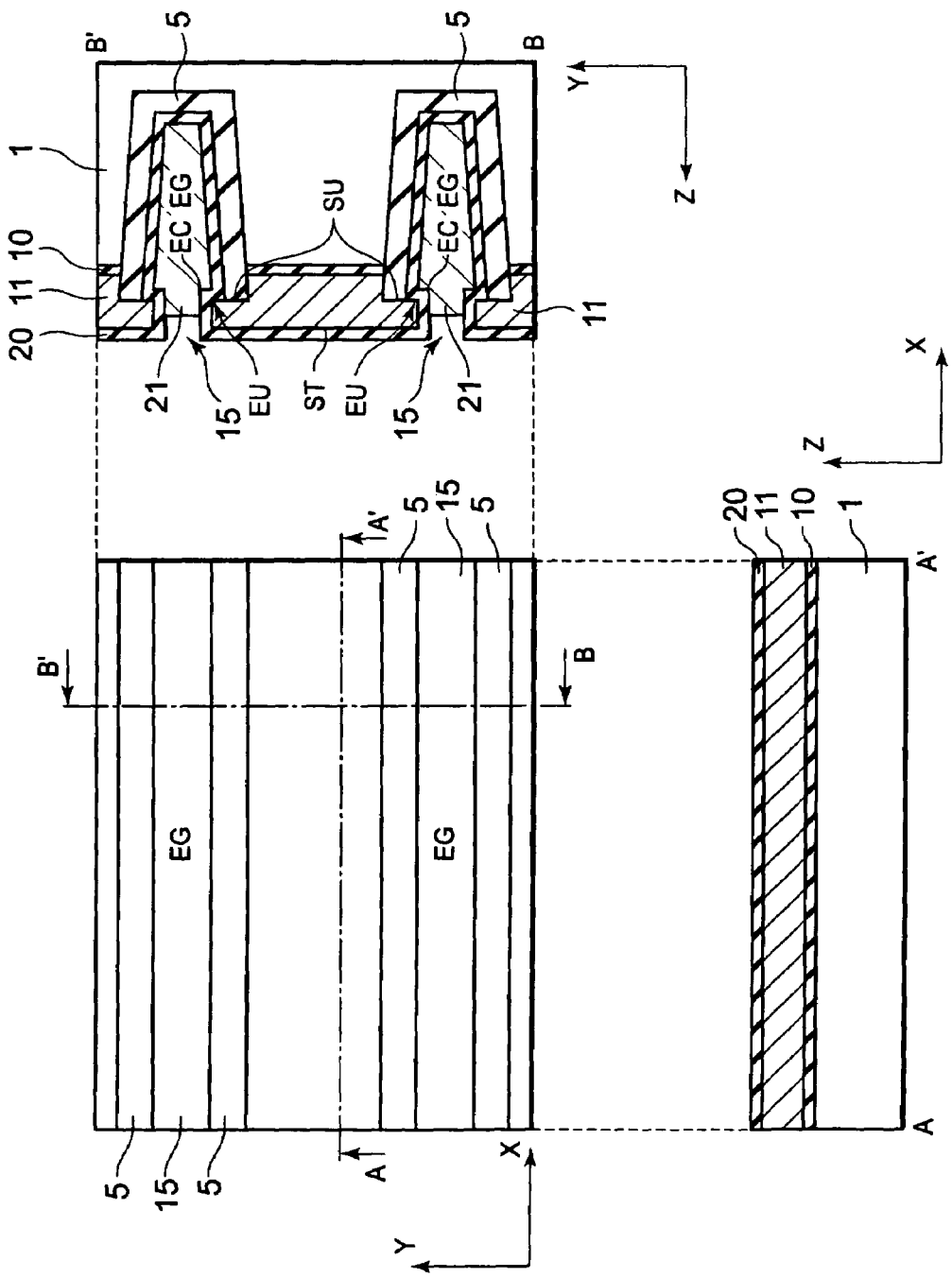
FIG. 7 shows another manufacturing process for the structure of the first exemplary embodiment.

An EG material film 21 is next deposited by the CVD method across the entire surface so as to embed the trench 15. This EG material film 21 is a film forming the material for the erase gate EG and is for example DOped POly-Silicon (DOPOS). Arsenic (As) serving as an impurity is then injected into the EG material film 21, and annealing is performed. The EG material film 21 is then etched back, and an erase gate EG is formed as shown in FIG. 7 extending in the X direction on the tunnel insulation film 20 within the trench 15. Etch back is implemented at this time so that the upper surface of the erase gate EG is lower than the ST upper surface of the FG material film 11. The erase gate EG is consequently formed so as to be embedded within the trench 15. The erase gate EG embedded within the trench 15 matches (faces opposite) the edge EU of the lower surface SU of FG material film 11, as shown in the B-B' cross section in FIG. 7. In particular here, a cavity EC on the erase gate EG is formed at a position equivalent to the above-described step TP. This cavity EC matches the lower edge EU on the FG material film 11 overlapping the STI structure 5.

Utilizing this trench 15 as described above allows forming the erase gate EG to self-align with the lower edge EU on the FG material film 11. In other words, making use of this FG slit allows self-alignment of the floating gate FG and the erase gate EG opposite the lower edge EU on the floating gate FG. This alignment helps reduce the surface area of individual cells.

Figure 8:
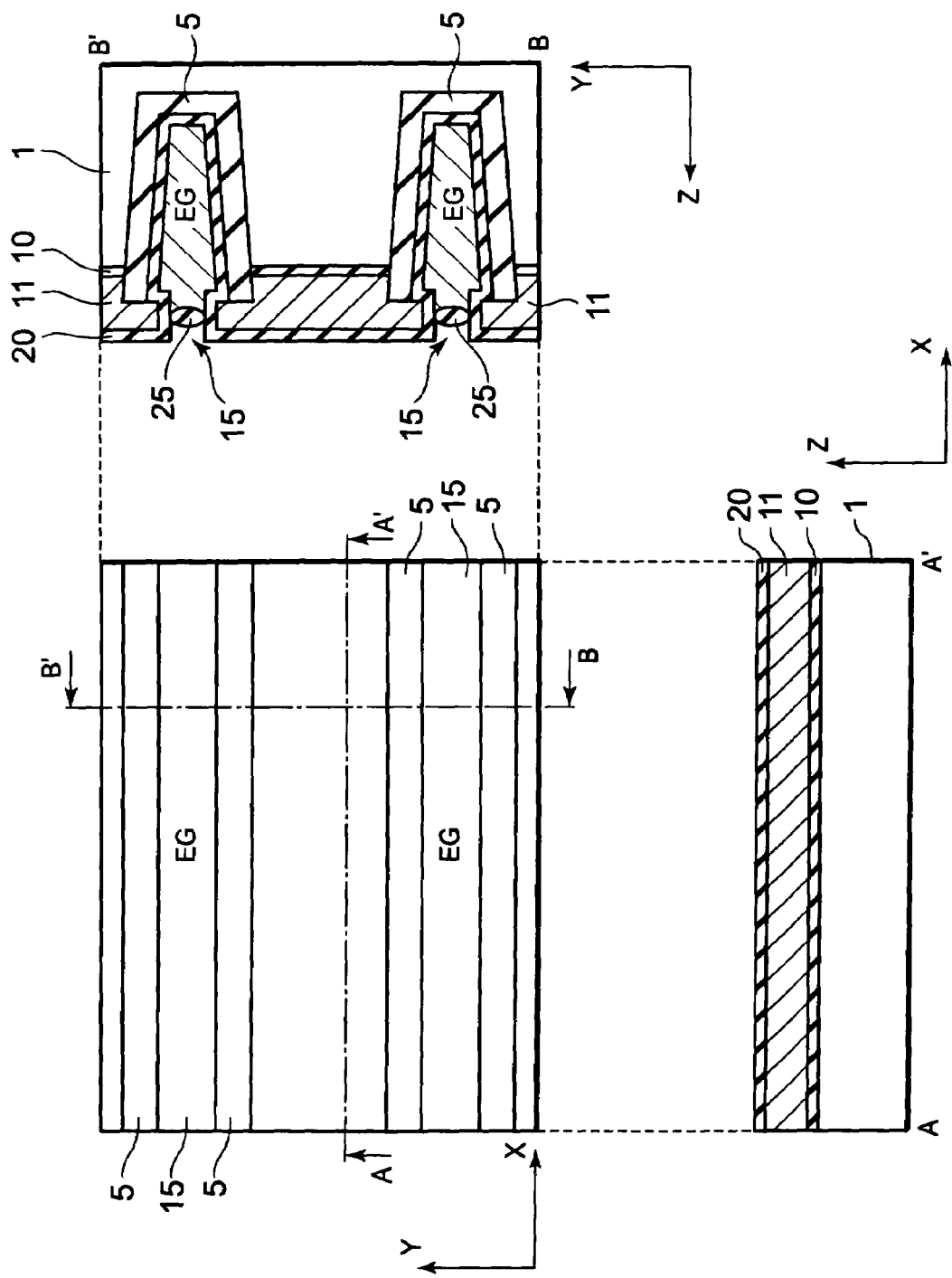
FIG. 8 shows yet another manufacturing process for the structure of the first exemplary embodiment.

Thermal oxidizing is next implemented to yield the structure shown in FIG. 8. Here, note that arsenic is injected as an impurity into the EG material film 21 as already described. Oxidation then occurs at high speed on the exposed surface of the erase gate EG with this high concentration of impurities. A comparatively thick protective insulation film 25 is consequently formed on the exposed surface of the erase gate EG within the trench 15. The thick protective insulation film 25 is formed so as to cover the upper surface of the erase gate EG embedded within this trench 15.

Figure 9:
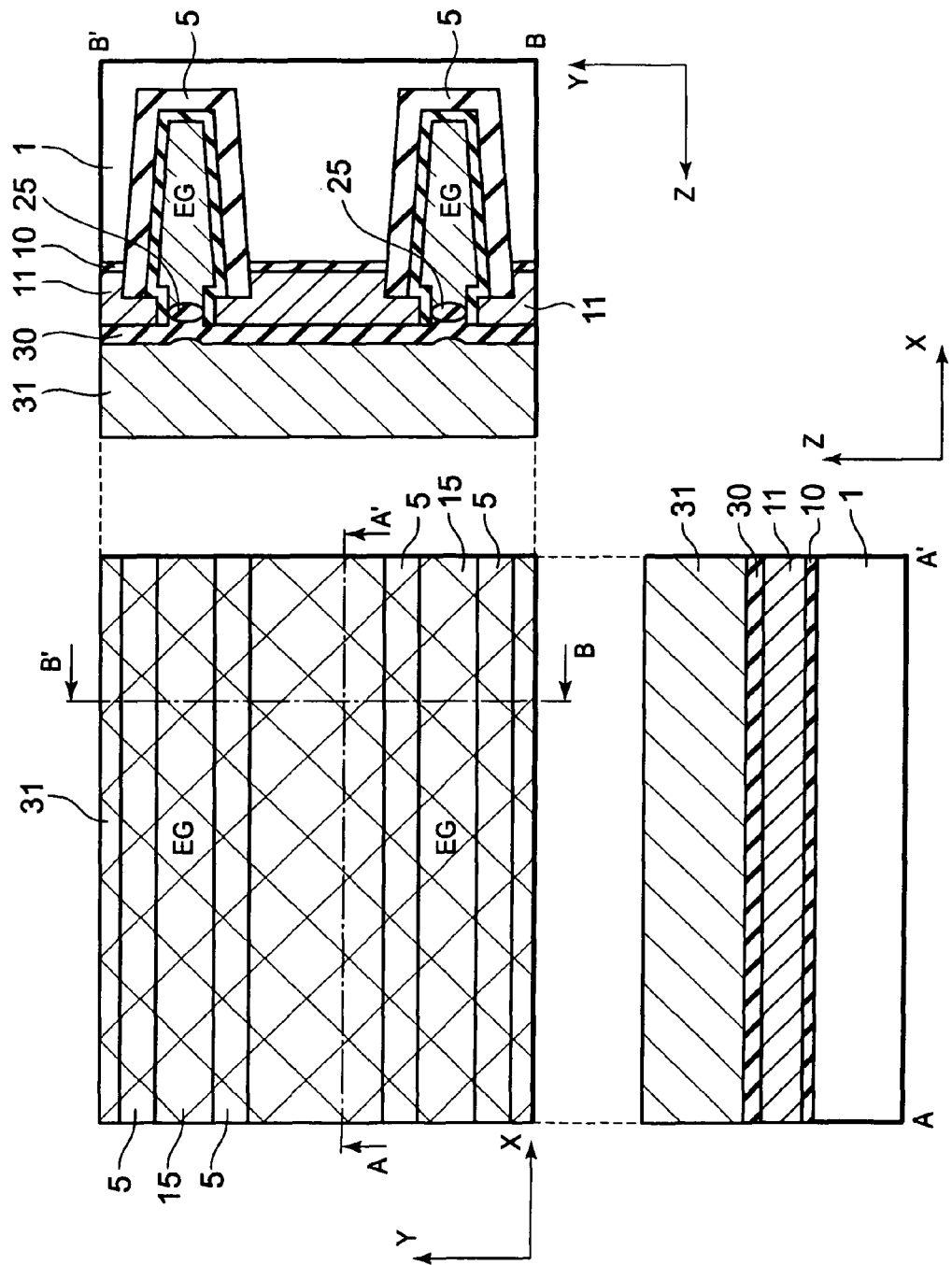
FIG. 9 shows still another manufacturing process for the structure of the first exemplary embodiment.

The insulation film 30 is next formed across the entire surface as shown in FIG. 9, after stripping away excess tunnel insulation film 20 on the FG material film 11 by etching. The insulation film 30 is, for example, an Oxide-Nitride-Oxide (ONO) film formed in sequence by the CVD method. The PG material film 31 is next formed across the entire surface by the CVD method. This PG material film 31 is, for example, a film forming the material for the program gate PG and, for example, is polysilicon. The PG material film 31 is shown by the hatching in the plan view in FIG. 9.

Figure 10:
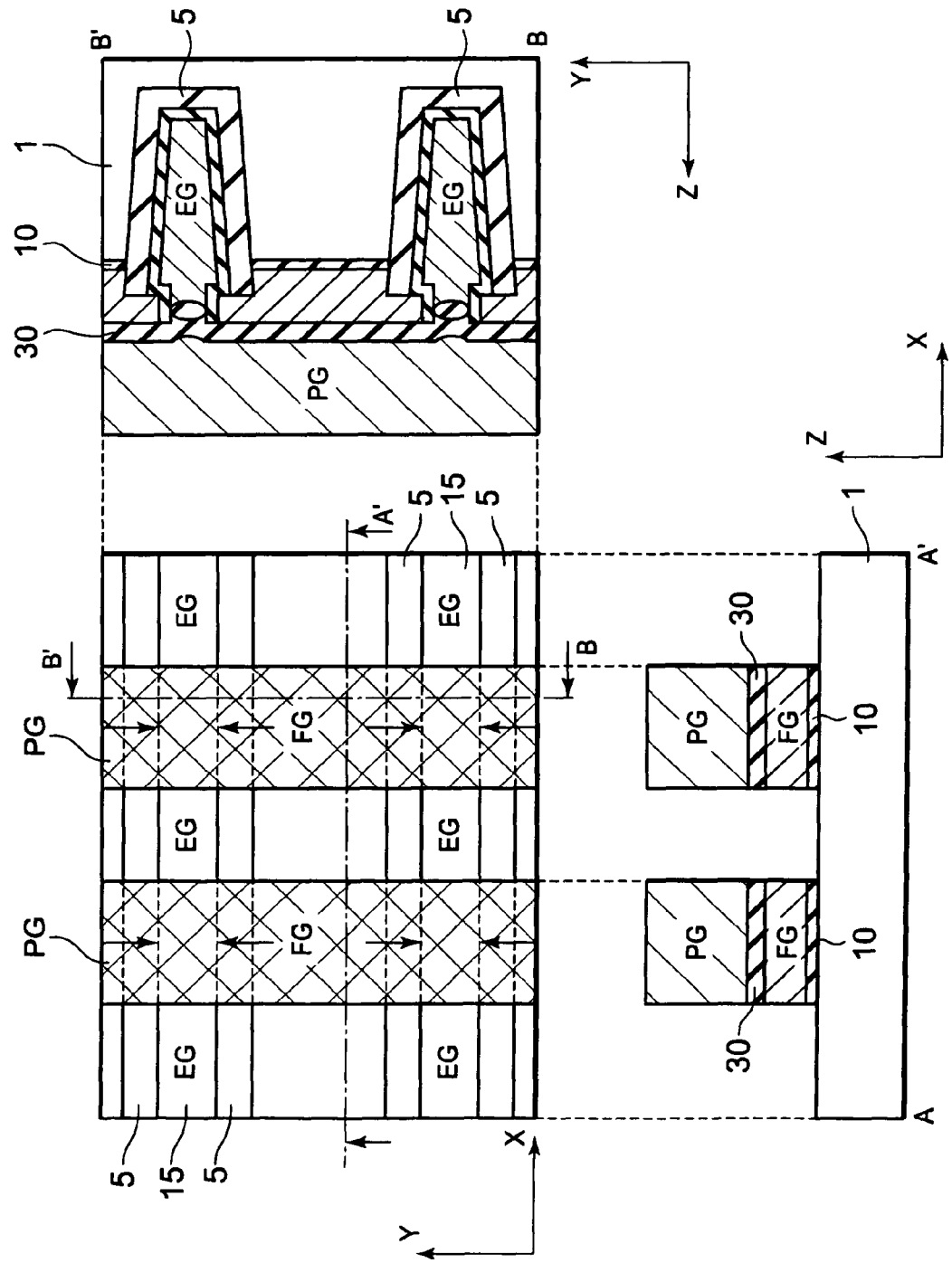
FIG. 10 shows another manufacturing process for the structure of the first exemplary embodiment.

The gate process is next implemented by forming the program gate PG and the floating gate FG in one process as shown in FIG. 10. More specifically, a resist mask (not shown in the drawing) including a pattern for the program gate PG extending in the Y direction, is formed by photolithography. This resist mask can be utilized to etch the PG material film 31, the insulation film 30, the FG material film 11, and the first gate insulation film 10. Patterning the PG material film 31 forms the program gate PG extending in the Y direction (shown by hatching in the plan view in FIG. 10). The patterning of the FG material film 11 on the other hand forms floating gates as data storage regions on each memory cell MC. Laminated structures of floating gates FG and program gates PG are in this way formed as shown on the A-A' cross section in FIG. 10.

Figure 11:
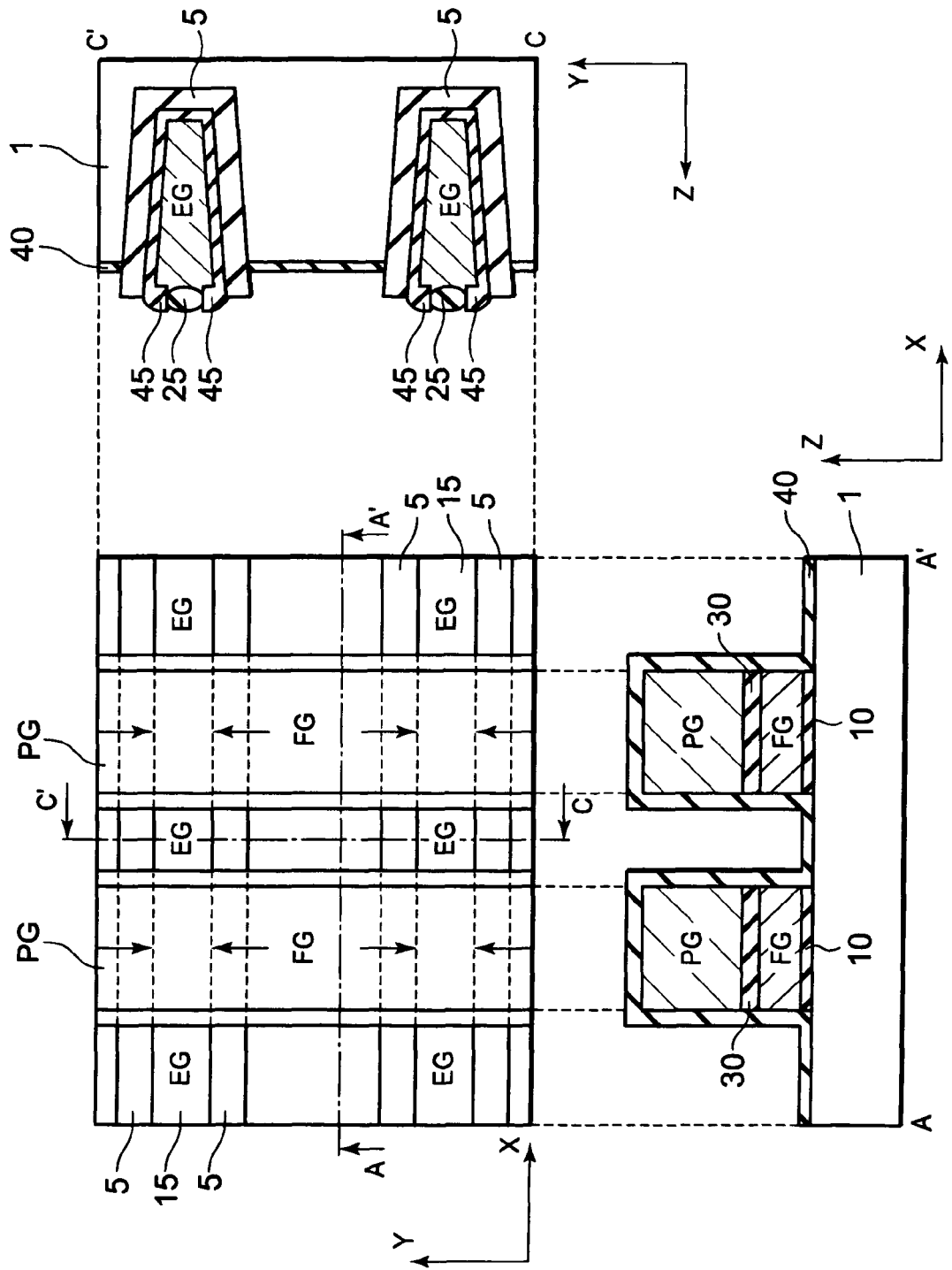
FIG. 11 shows yet another manufacturing process for the structure of the first exemplary embodiment.
Figure 12:
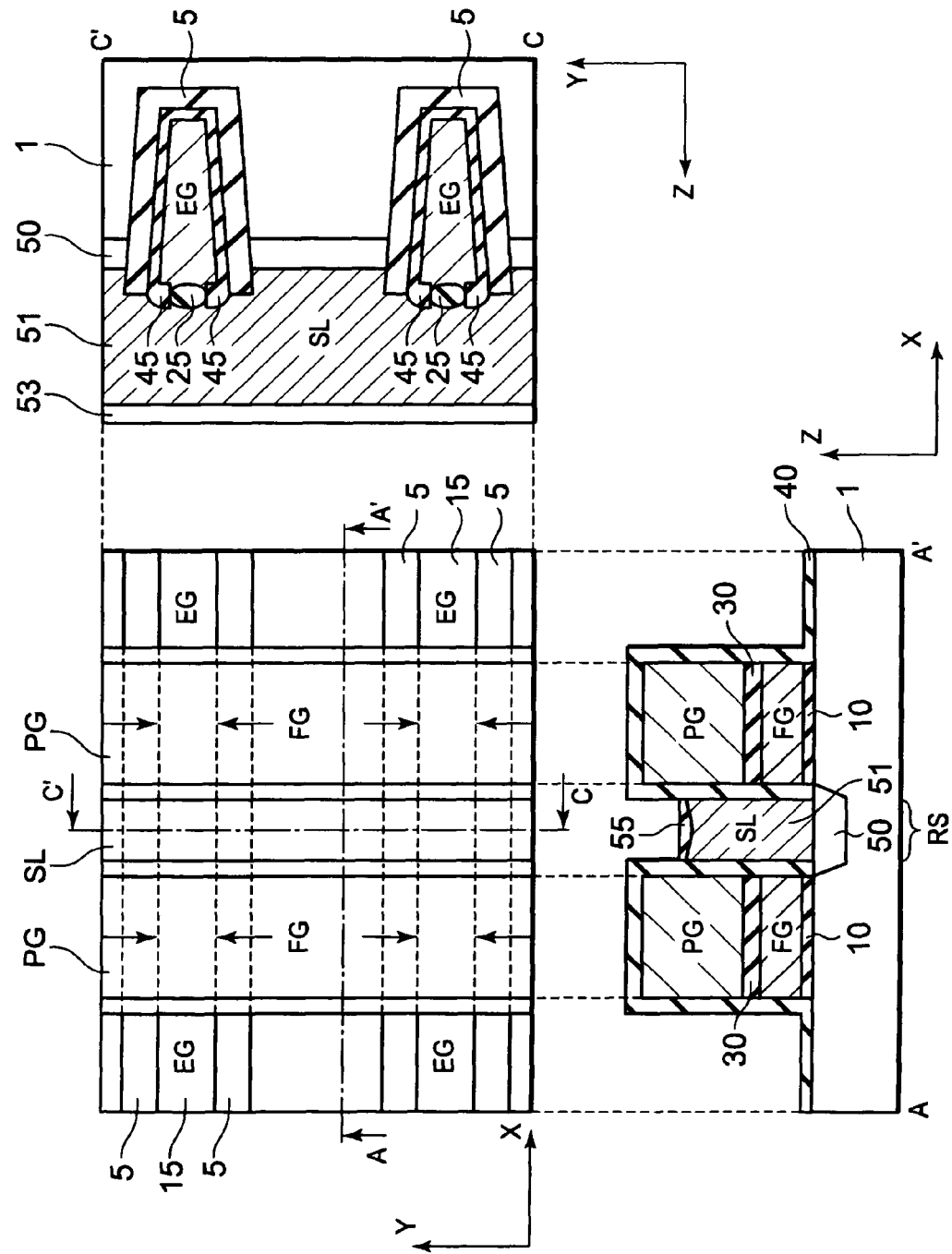
FIG. 12 shows still another manufacturing process for the structure of the first exemplary embodiment.

The XY flat structure, the A-A' cross sectional structure, and the C-C' cross section structure in the subsequent manufacturing process are shown in FIG. 11 and FIG. 12.

Thermal oxidizing is first performed to form the protective insulation film over the entire surface as shown in FIG. 11. More specifically, a protective insulation film 40 is formed so as to cover the laminated structure including the floating gate FG and program gate PG, and semiconductor substrate 1 as shown in the A-A' cross section. A protective insulation film 45 is formed at the same time as shown in the cross section C-C' on both sides of the protective insulation film 25 exposed due to the gate process. Protective insulation film 45 is also thickly formed on the erase gate EG by accelerated oxidizing. Protective insulation film 45 is in the same way formed on the D-D' cross section (See FIG. 13).

A source line SL (e.g., source plug) is formed extending in the Y direction as shown in FIG. 12. More specifically, ions are injected and the first diffusion region 50 is formed within the semiconductor substrate 1 in the region RS where the source line SL is formed. The protective insulation film 40 on region RS is then stripped away by etching. An SL material film 51 is then deposited across the entire area by the CVD method. The SL material film 51 is a film making up the material for the source line SL, and, for example, is DOPOS. Further, annealing is performed after injecting arsenic (As) as an impurity into the SL material film 51. The SL material film 51 is then etched back. Etch back is performed at this time so that the upper surface of the SL material film 51 is lower than the upper surface of the program gate PG. A protective insulation film 55 is then formed on the SL material film 51 by thermal oxidizing. One result of the above etch back process is that unneeded SL material film 51 still remains in a sidewall shape on regions other than the region RS, and thus this unnecessary SL material film is stripped away by etching. The source line SL (source plug) is thus formed on the first diffusion region 50 as shown in FIG. 12. Forming the source line SL by etch back shortens the distance between the program gates PG, and reduces the surface area of individual cells.

Figure 13:
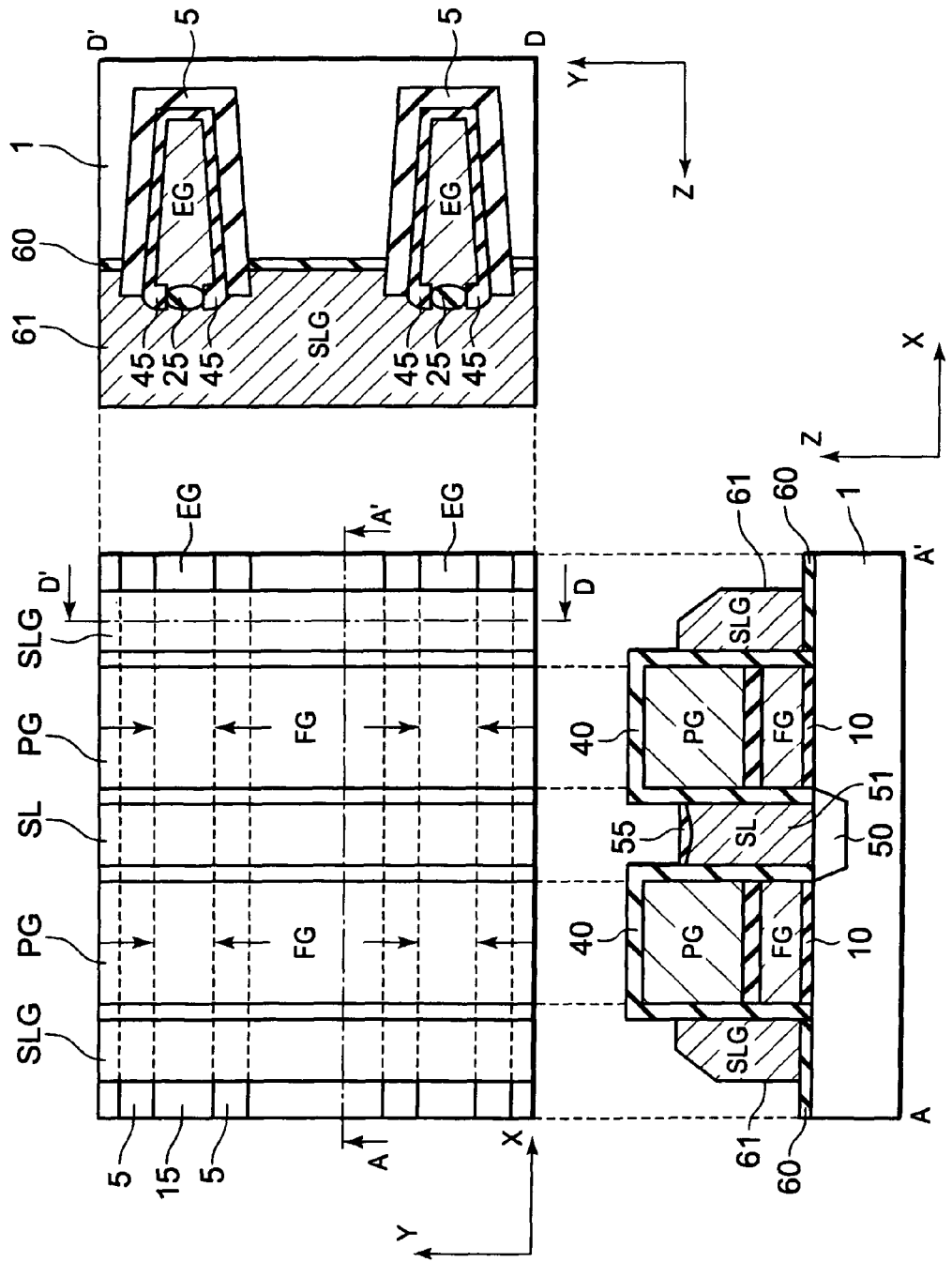
FIG. 13 shows another manufacturing process for the structure of the first exemplary embodiment.

The select gate SLG extending in the Y direction is then formed, as shown in FIG. 13. The XY flat structure, the A-A' cross sectional structure, and the D-D' cross sectional structure are shown in FIG. 13. First, excess protective insulation film 40 on the semiconductor substrate 1 is stripped away. Thermal oxidation is then performed to form a thin second gate insulation film 60 on the semiconductor substrate 1. Moreover, an SLG material film 61 is deposited by the CVD method across the entire surface. SLG material film 61 is a film forming the material for the select gate SLG and is, for example, polysilicon. This SLG material film 61 is then etched back. A select gate SLG is consequently formed by way of the second gate insulation film 60 on the floating gate FG side of the semiconductor substrate 1.

The select gate SLG and the second gate insulation film 60 in the memory region can also be formed by the same process as the peripheral transistors. The laminated film formed on the peripheral region is first stripped away by etching. Excess protective insulation film 40 within the memory region is also stripped away at this time. The gate insulation film for the peripheral transistors is next formed in the peripheral area by gate oxidation processing, and a second gate insulation film 60 is formed on the memory region. Preferably, a thin second gate insulation film 60 can be formed jointly with the thin gate insulation film for the peripheral transistors. This gate material film is then etched after a gate material film such as polysilicon is deposited across the entire surface. This processing consequently forms the gate electrodes for the peripheral transistors in the peripheral area, and forms the select gate SLG in the memory area.

Figure 14:
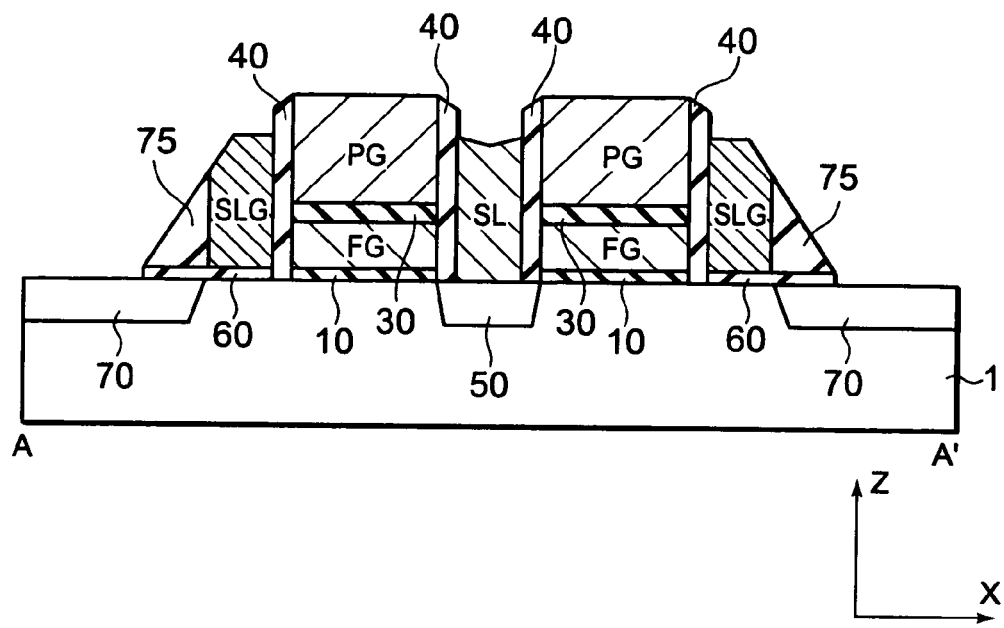
FIG. 14 shows yet another manufacturing process for the structure of the first exemplary embodiment.

The subsequent processes are described next while referring to FIG. 14 through FIG. 16. Only the A-A' cross section structure is described in FIG. 14 through FIG. 16. The processes described in FIG. 14 through FIG. 16 can also be implemented jointly with the manufacturing processes for the peripheral transistors.

A Lightly Doped Drain (LDD) is first formed on the semiconductor substrate 1 by LDD injection processing. Next, etch back is performed after depositing an insulation film across the entire surface by the CVD method. A sidewall 75 is consequently formed on the side surface of the select gate SLG as shown in FIG. 14. In this etch back process, excess second gate insulation film 60 on the semiconductor substrate 1, as well as a protective insulation film respectively on the program gate PG, source line SL and the erase gate EG, are stripped away. Ion injection is then performed, forming the second diffusion region 70 on the semiconductor substrate 1 as shown in FIG. 14.

Figure 15:
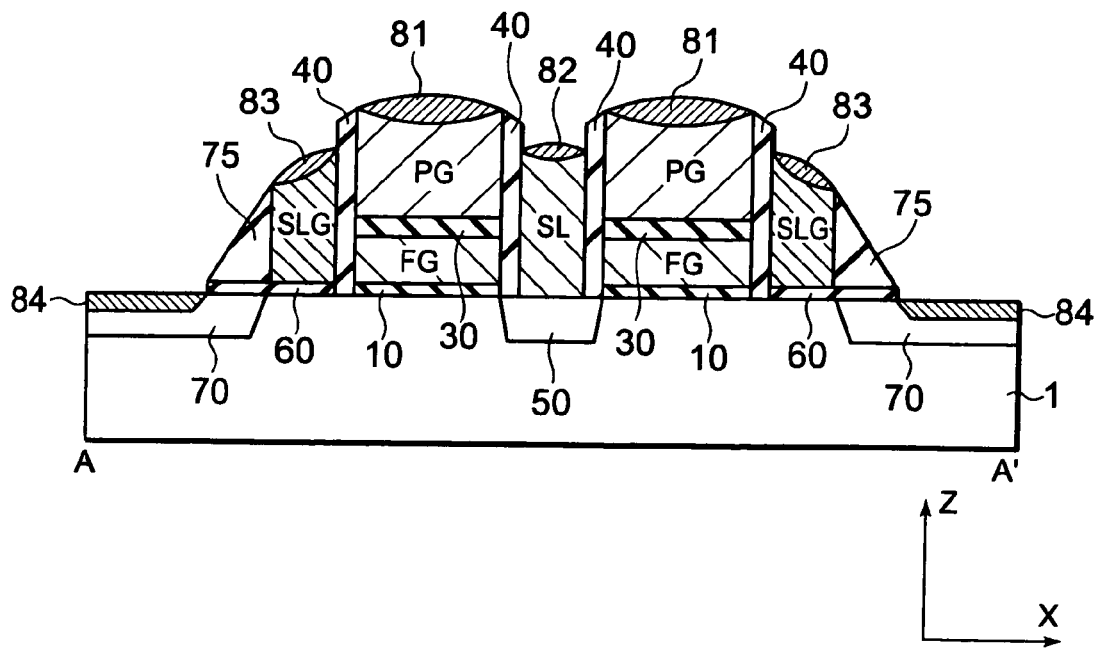
FIG. 15 shows still another manufacturing process for the structure of the first exemplary embodiment.

Siliciding is then performed to form the silicide film as shown in FIG. 15. More specifically, a metallic film (for example: cobalt (Co) film) is formed by sputtering across the entire surface and heat treatment then performed. The upper surfaces of the program gate PG, source line SL, select gate SLG, the second diffusion region 70 and the erase gate EG are consequently subjected to siliciding to form the silicide films 81, 82, 83, 84, and 85.

Figure 16:
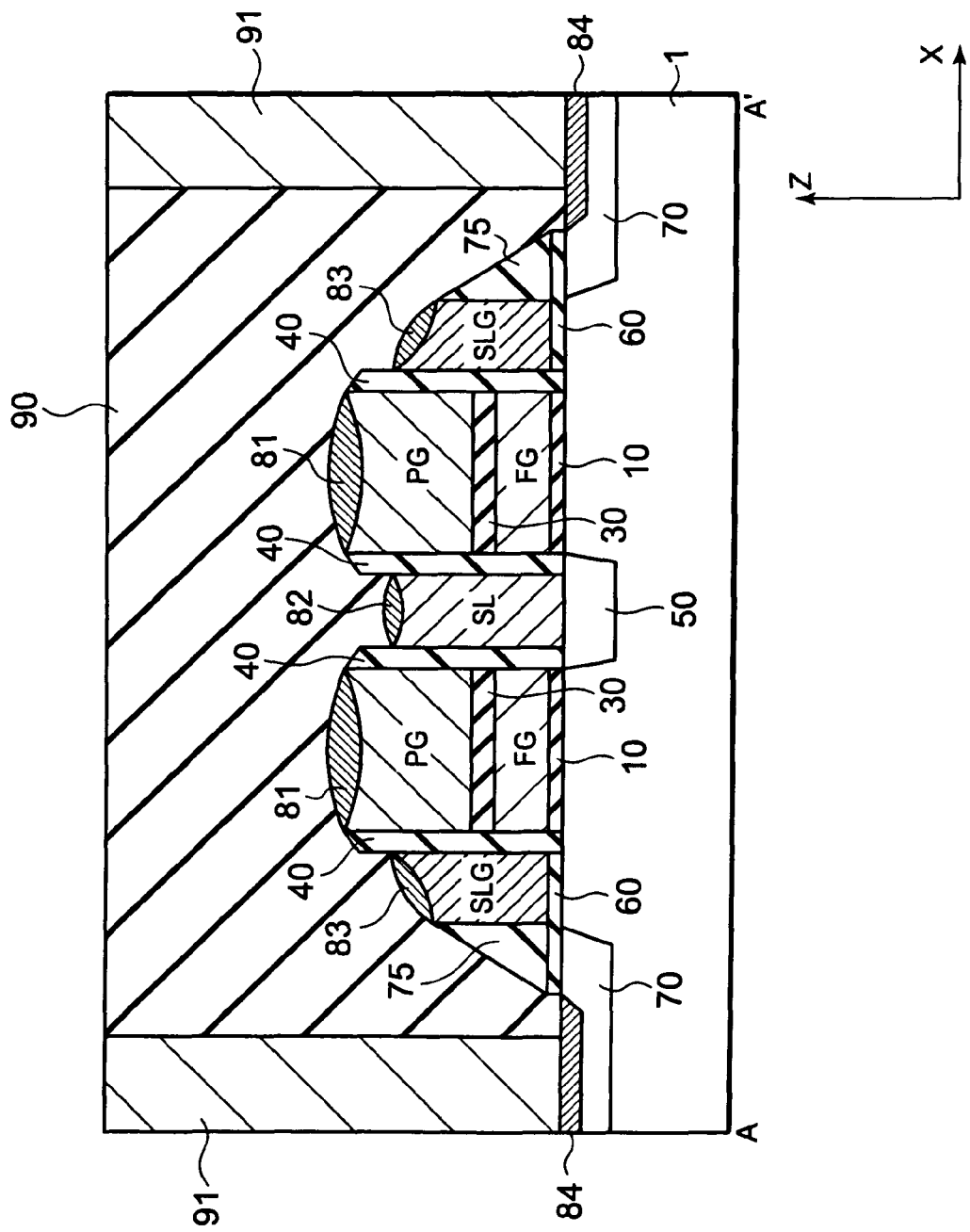
FIG. 16 shows another manufacturing process for the structure of the first exemplary embodiment.

An interlayer insulation film 90 is next formed across the entire surface by the CVD method, as shown in FIG. 16. The interlayer insulation film 90 is then planarized by Chemical Mechanical Polishing (CMP). A contact 91 is then formed by photolithography. Contact 91 is formed so as to connect to the silicide film 84 on the second diffusion region 70 by penetrating through the interlayer insulation film 90.

Figure 17:
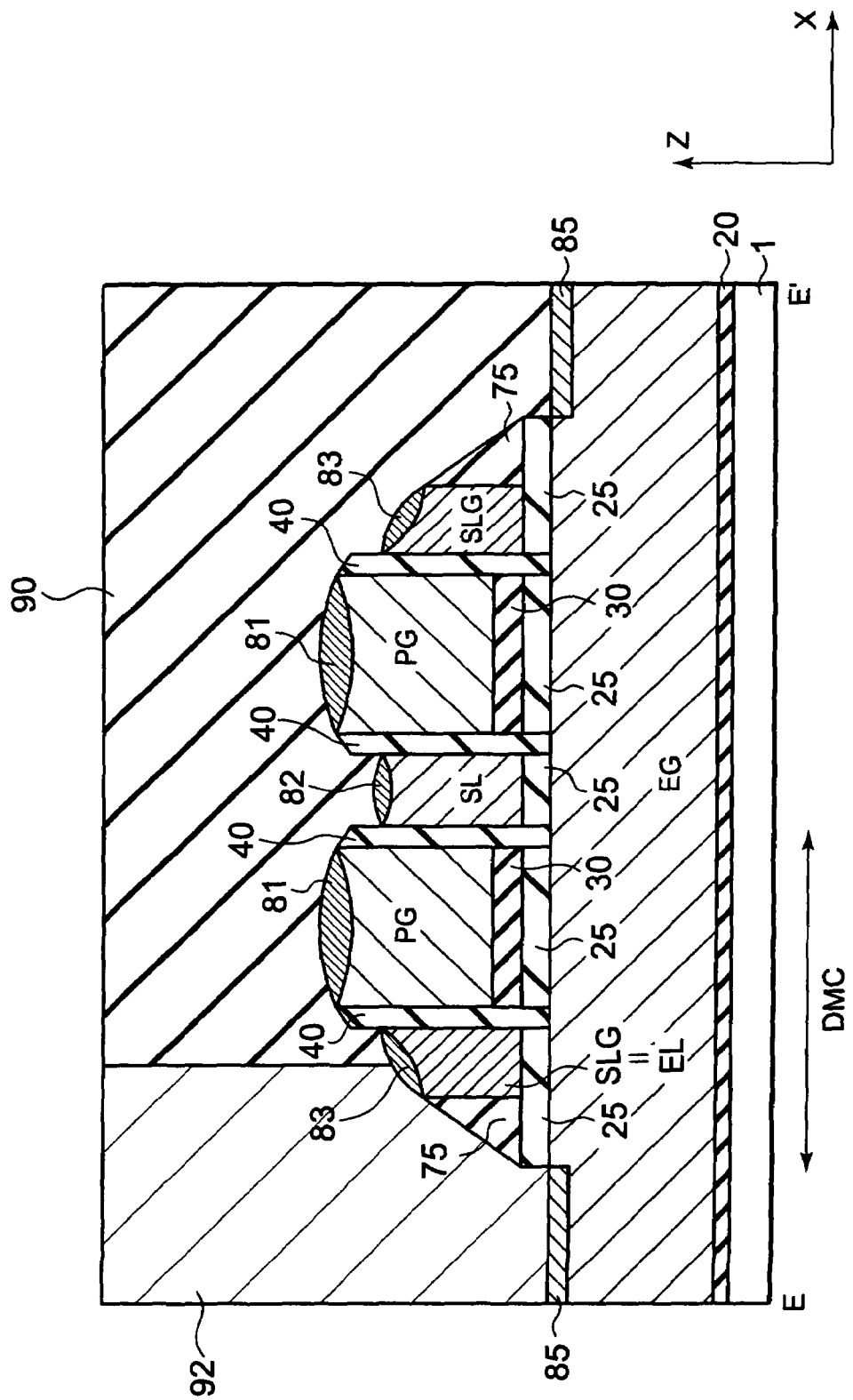
FIG. 17 shows yet another manufacturing process for the structure of the first exemplary embodiment.

FIG. 17 shows the E-E' cross sectional structure at this time. A contact 92 is formed as described above by photolithography at the end of the single erase block. This contact 92 is formed so as to penetrate through the interlayer insulation film 90 and connect to the silicide film 85 on the erase gate EG. Contact 92 is further formed so as to contact the silicide film 83 formed on the select gate SLG of the dummy cell DMC. The erase gate EG at the end of the single erase block is in this way electrically connected by way of the contact 92 to the select gate SLG of the dummy cell DMC. The select gate SLG of the dummy cell DMC forms an erase line EL for drawing the erase gate EG out in the Y direction.

Bit lines (not shown in the drawing) connecting to the contact 91 are then formed extending in the X direction. Upper layer wiring is also formed. The nonvolatile semiconductor memory of the first exemplary embodiment is thus manufactured as described above.

3. Operation

An operation of the nonvolatile semiconductor memory of the first exemplary embodiment is described next.

(Program)

Figure 18:
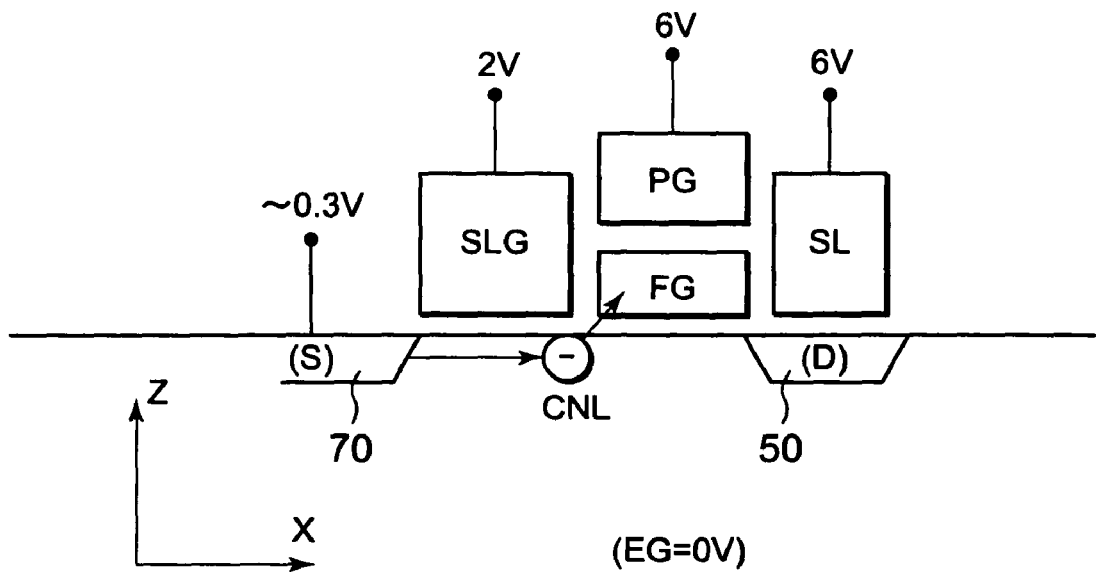
FIG. 18 is a conceptual diagram for describing a data programming operation.

A data programming is implemented by the CHE method. Source Side Injection (SSI), which is one type of CHE method, is performed here. FIG. 18 shows an example of a voltage potential applied during the data programming operation. Voltages of 2 volts, 6 volts, 0 volts, 6 volts, and 0.3 volts, for example, are respectively applied to the select gate SLG, the program gate PG, the erase gate EG, the source line SL, and a bit line (e.g., the second diffusion region 70). At this time, the first diffusion region 50 functions as the drain, while the second diffusion region 70 functions as the source. Electrons discharged from the second diffusion region 70 are accelerated in the channel region CNL and become "hot electrons". A large number of hot electrons are in particular generated in the vicinity of the boundary between the select gate SLG and the floating gate FG due to their strong electrical fields. A portion of the hot electrons that are generated are injected into the floating gate FG. A threshold value for the memory cell transistor consequently increases.

(Erase)

Figure 19:
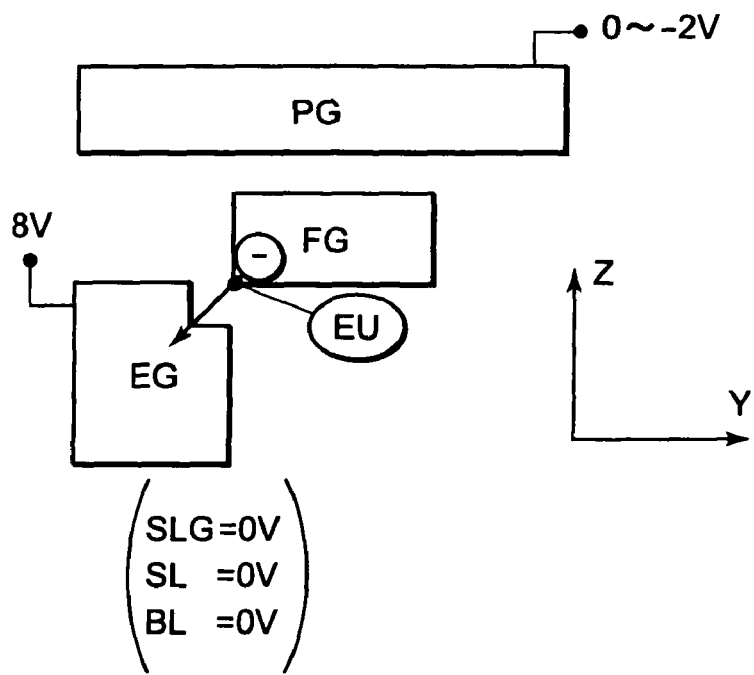
FIG. 19 is a conceptual diagram for describing a data erase operation.

The FN tunneling method is utilized for data erasure. FIG. 19 shows an example where a voltage is applied during data erase operation. Here, voltages of 0 volts, 0 volts, 8 volts, 0 volts, and 0 volts are, for example, respectively applied to the select gate SLG, the program gate PG, the erase gate EG, the source line SL, and the bit line (the second diffusion region 70). In other words, a high voltage potential is applied to the erase gate EG. Electrons within the floating gate FG are consequently extracted by FN tunneling to the erase gate EG via the tunnel insulation film 20. The threshold value for the memory cell transistor is thus decreased.

The erase gate EG of the first exemplary embodiment is placed diagonally below the floating gate FG, as already described. In other words, this placement eliminates the excessive capacitive coupling between the erase gate EG and the floating gate FG. The reduced capacitive coupling between the erase gate EG and the floating gate FG functions to increase the erase operation speed and improve the erase efficiency. Moreover, a "concentrated electrical field" is generated in the vicinity of the lower edge EU of the floating gate FG. The erase efficiency (electron extraction efficiency) is even further improved because the erase gate EG matches (is opposite) the lower edge EU of the floating gate FG. Preferably, the erase gate EG includes a cavity EC matching the lower edge EU in order to intensify the concentrated electrical field.

A negative voltage of approximately −2 volts may be applied to the program gate PG in order to assist the FN tunneling. This negative voltage potential in that case functions to lower the voltage potential on the floating gate, and to increase the voltage differential between the floating gate FG and the erase gate EG. This negative voltage therefore improves the erase efficiency even further.

(Read)

Figure 20:
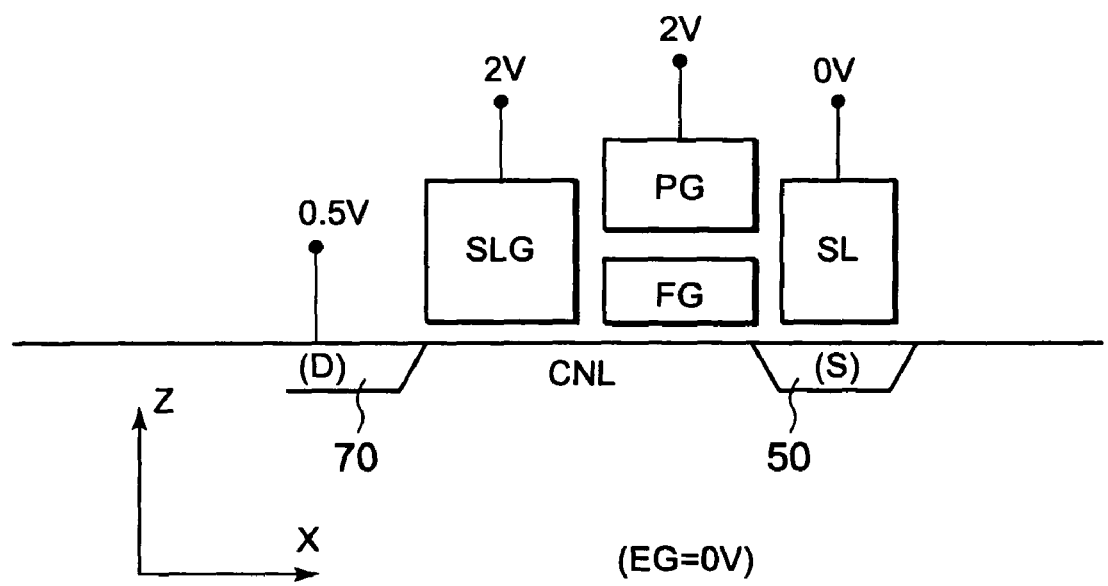
FIG. 20 is a conceptual diagram for describing a data read operation.

FIG. 20 shows an example of a voltage applied during the data read operation. Voltages of 2 volts, 2 volts, 0 volts, 0 volts, and 0.5 volts are, for example, respectively applied to the select gate SLG, the program gate PG, the erase gate EG, the source line SL, and the bit line (e.g., the second diffusion region 70). The first diffusion region 50 at this time functions as the source, while the second diffusion region 70 functions as the drain. When the memory cell transistor is in the program state, the read current is not prone to flow due to the high threshold voltage of the memory cell transistor. On the other hand, when the memory cell transistor is in the erase state, the read current tends to easily flow due to the low threshold voltage of the memory cell transistor. Data can be identified by comparing the specified reference levels of read current.

4. Effect

In the first exemplary embodiment, the erase gate for performing data erasure is formed separately. During data erasure, a high voltage is applied to erase gate EG so there is no need to apply a high voltage to the select gate SLG. In terms of reliability, there is therefore no need to make the second gate insulation film 60 located directly below the select gate SLG, a thick film. Thus, the second gate insulation film 60 can be made as thin as possible. This thin film contributed to increasing the read current and improving the read speed.

Moreover, in the first exemplary embodiment, the erase gate EG is positioned lower than the upper surface ST of the floating gate FG, and is formed opposite the lower edge EU of the floating gate FG. The erase gate EG is, in other words, positioned diagonally below the floating gate FG. Excess capacitive coupling between the erase gate EG and the floating gate FG is therefore eliminated. The erase operation speed improves and the erase efficiency is enhanced since the capacitive coupling between the erase gate EG and the floating gate FG has been lowered. Moreover, during a data erase operation, a concentrated electrical field is generated in the vicinity of the lower edge EU of the floating gate. The erase gate matches the lower edge EU of the floating gate FG so that the erase efficiency (e.g., an electron extraction efficiency) is further improved by this concentrated electrical field. The first exemplary embodiment is therefore capable of improving the read speed along with the erase speed.

The erase gate EG can also be embedded in the STI structure 5 as already described if the erase gate EG is placed diagonally below the floating gate FG. In this case, the erase gate EG is formed separately and the device isolation region is utilized effectively. Along with forming separate erase gate EG, an increase in the surface area of the individual cells is thus prevented. Moreover if the erase gate EG is embedded in the trench 15 (FG slit), then the erase gate EG and floating gate FG can be formed to self-align with each other as already described. The surface area of the individual cells can thus be reduced.

In the first exemplary embodiment, the erase gate EG is not formed on the first diffusion region 50 or on the source line SL. The upper surface of the source line SL can therefore be silicided, and the source resistance reduced during the data read operation. The read current is therefore increased and the read speed improved.

In the first exemplary embodiment, a program gate PG is formed on the floating gate FG. During the data read and data programming, the voltage potential on the floating gate FG can be raised by applying a specified voltage potential to the program gate PG. There is no need to utilize the capacitive coupling between the first diffusion region 50 and the floating gate FG in order to raise the voltage potential on the floating gate FG. The gate length of the floating gate FG can be shortened and the surface area of individual cells can therefore be reduced, since there is no need to enlarge the overlapping of the first diffusion region 50 and the floating gate FG.

5. Modifications

Figure 21:
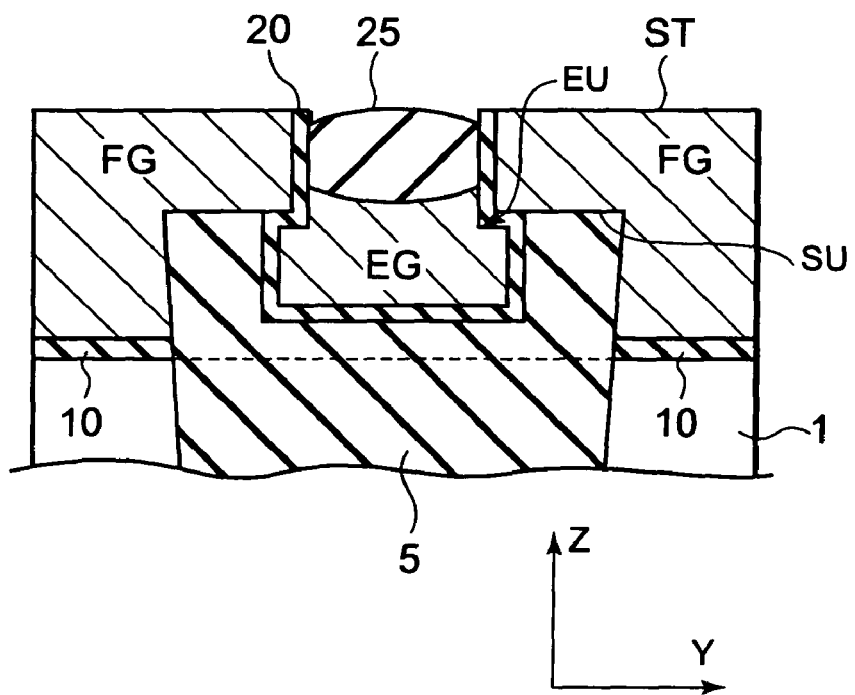
FIG. 21 is a cross sectional view showing a modification of the exemplary first embodiment.

The nonvolatile semiconductor memory of the first exemplary embodiment is not limited to the above examples. If the STI structure 5 protrudes from the surface of the semiconductor substrate 1, as shown for example in FIG. 21, then the entire erase gate EG can be formed within that protruding section. In that case, the entire erase gate EG will be positioned above the surface of the semiconductor substrate 1. However, there is no change in its position diagonally below the floating gate FG, and the same effect is achieved. The manufacturing process is also the same. The same structure as shown in FIG. 21 can be achieved just by adjusting the depth of the trench (FG slit) 15.

Figure 22:
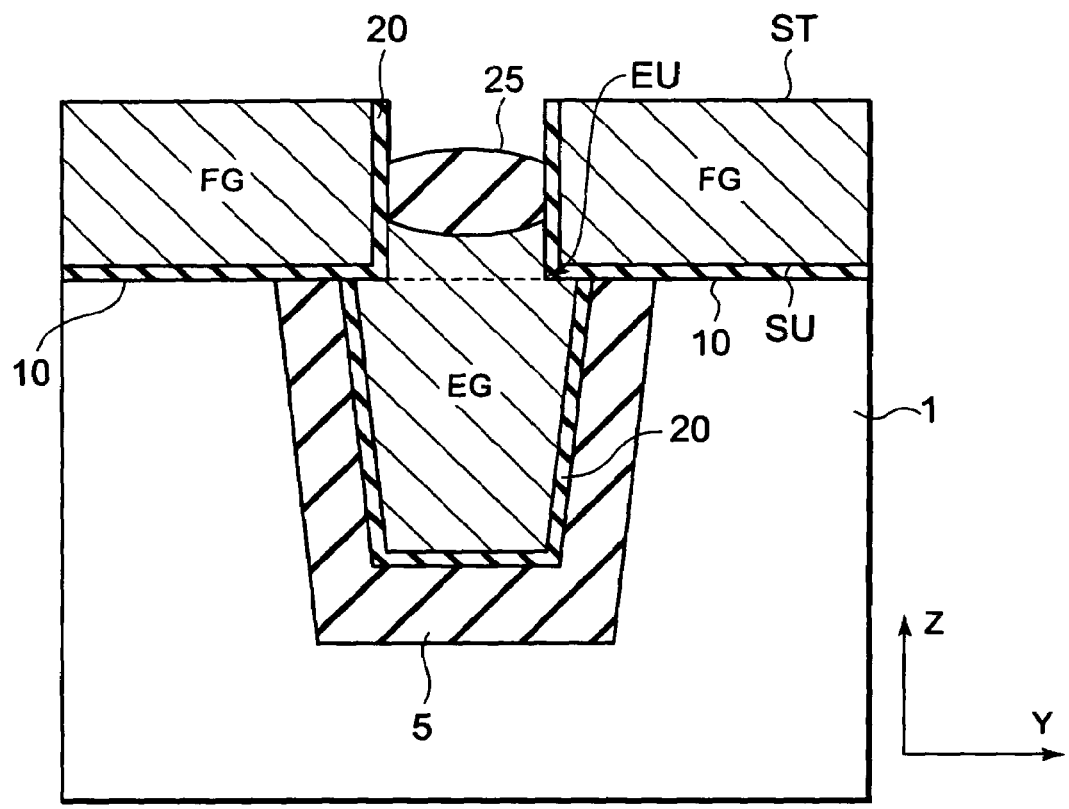
FIG. 22 is a cross sectional view showing another modification of the first exemplary embodiment.

Moreover, the STI structure 5 as shown in FIG. 22 for example need not protrude from the surface of the semiconductor substrate 1. The cross sectional structure of the floating gate FG is in this case a rectangle. The erase gate EG is embedded in the STI structure 5, and positioned diagonally below the floating gate FG. Consequently, the same effect is obtained. The manufacturing process is also the same.

Figure 23:
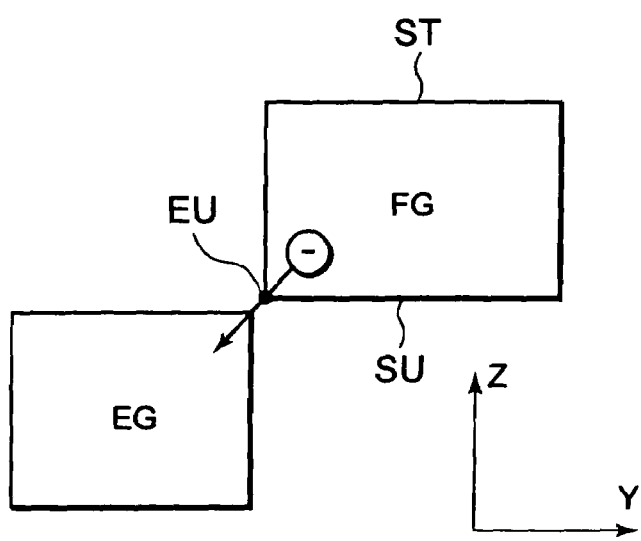
FIG. 23 is a conceptual diagram showing the nonvolatile semiconductor memory device of the first exemplary embodiment.

FIG. 23 is a conceptual diagram showing in more common terms the positional relation between the floating gate FG and the erase gate EG. It is noted that the erase gate EG is positioned lower than the upper surface ST of the floating gate FG, and matches (faces opposite) the edge EU of the lower surface SU of the floating gate FG. The opposing surface areas on the erase gate EG and floating gate FG thus become smaller, and the coupling capacitance is reduced. The electron extraction efficiency is also improved by utilizing the concentrated electrical field generated in the vicinity of the lower edge EU of the floating gate FG.

Second Exemplary Embodiment

In the second exemplary embodiment of this invention, there is no program gate PG. The same reference numerals are assigned to the same structures as in the first exemplary embodiment, and redundant descriptions are omitted.

Figure 24:
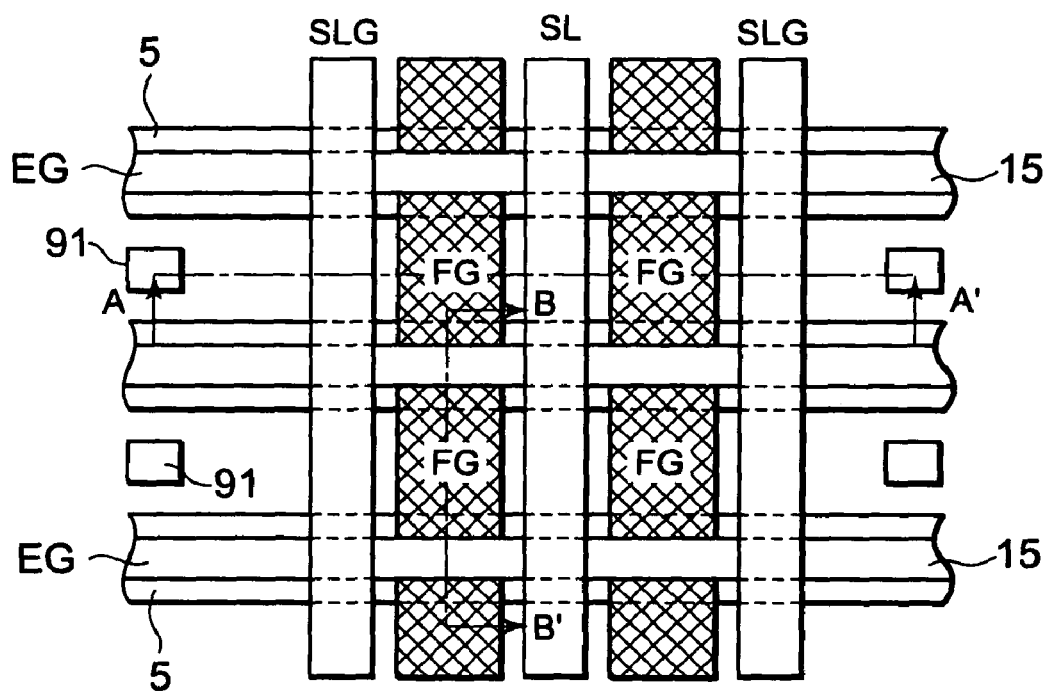
FIG. 24 is a plan view showing an overall structure of a nonvolatile semiconductor memory device of a second exemplary embodiment.
Figure 25A:
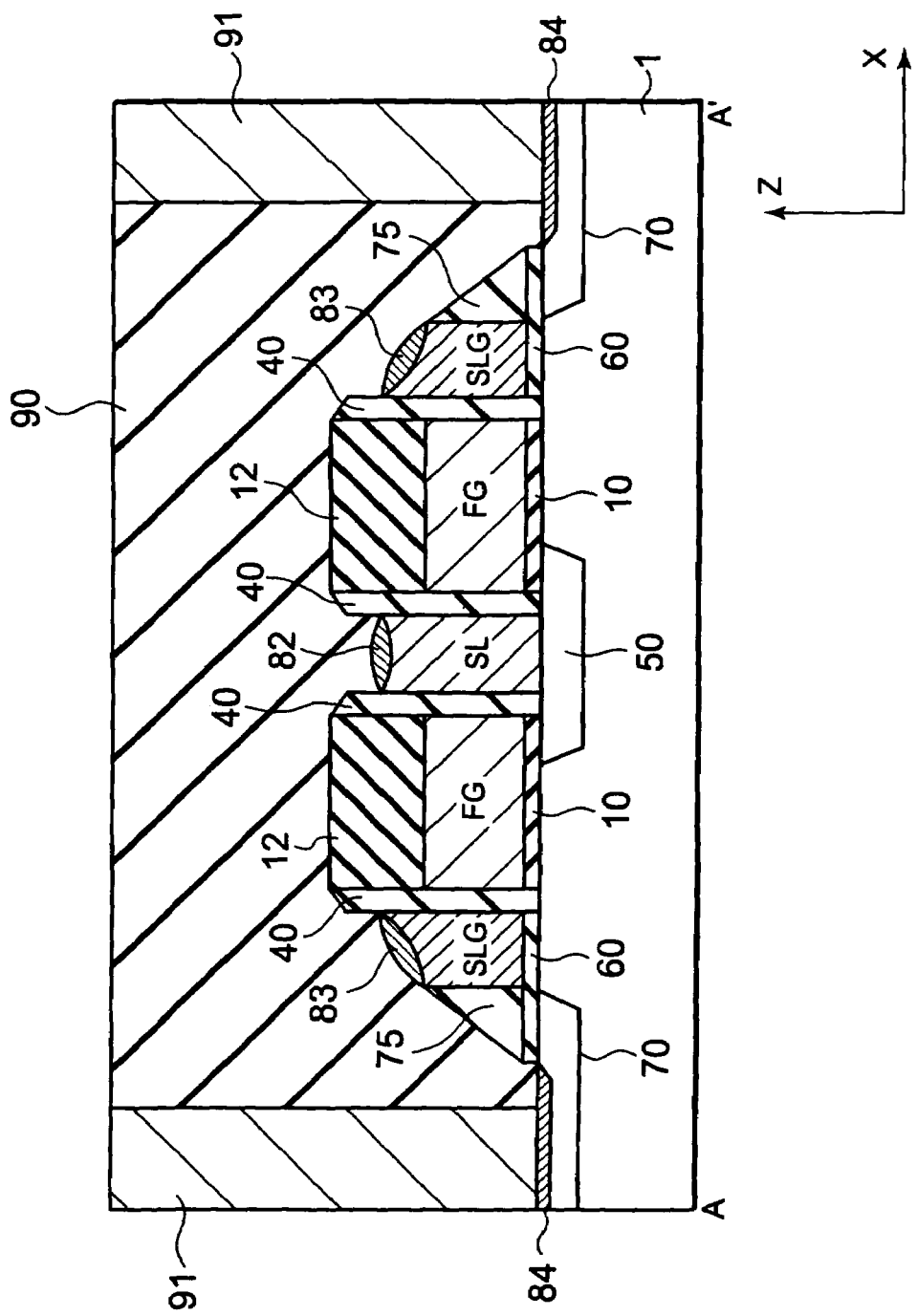
FIG. 25A is a cross sectional view showing a structure along lines A-A' in FIG. 24.
Figure 25B:
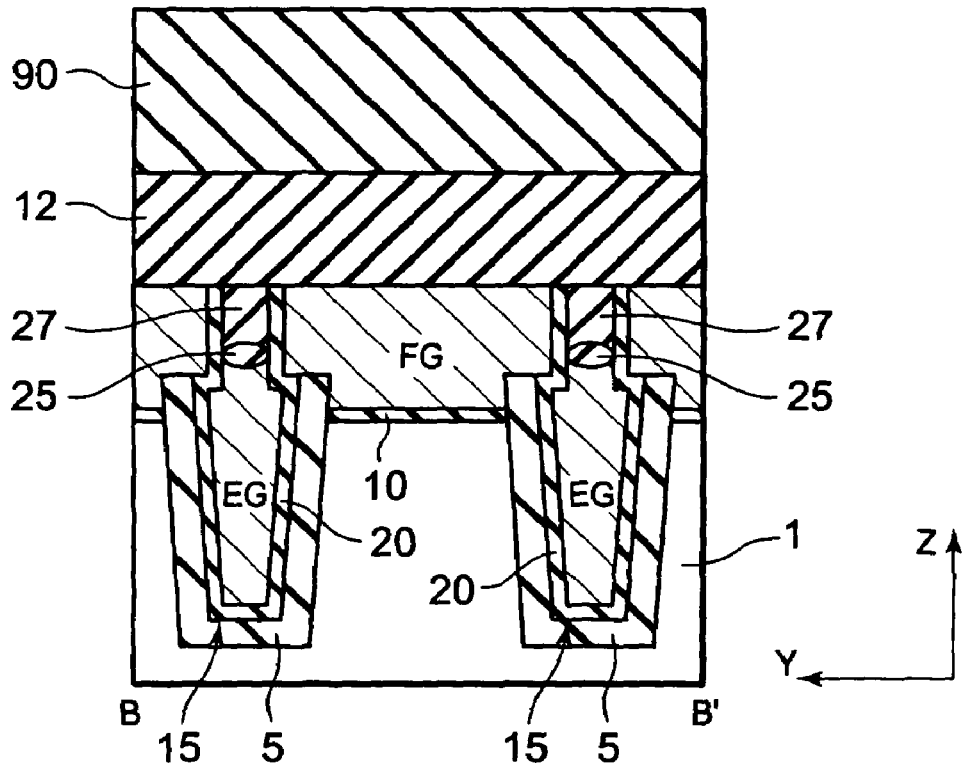
FIG. 25B is a cross sectional view showing a structure along lines B-B' in FIG. 24.

FIG. 24 is a plan view showing an overall structure of the nonvolatile semiconductor memory of the second exemplary embodiment. FIG. 25A and FIG. 25B respectively show the cross sectional structure long the lines A-A' and lines B-B' in FIG. 24. As shown in FIG. 25A, the program gate PG has been eliminated. Instead of the program gate PG, a thick insulation film 12 is formed on the floating gate FG. An insulation film 27 is also embedded in the trench region between the insulation film 12 and the protective insulation film 25, as shown in FIG. 25B.

A manufacturing method for the nonvolatile semiconductor memory of the second exemplary embodiment is described next.

Figure 26:
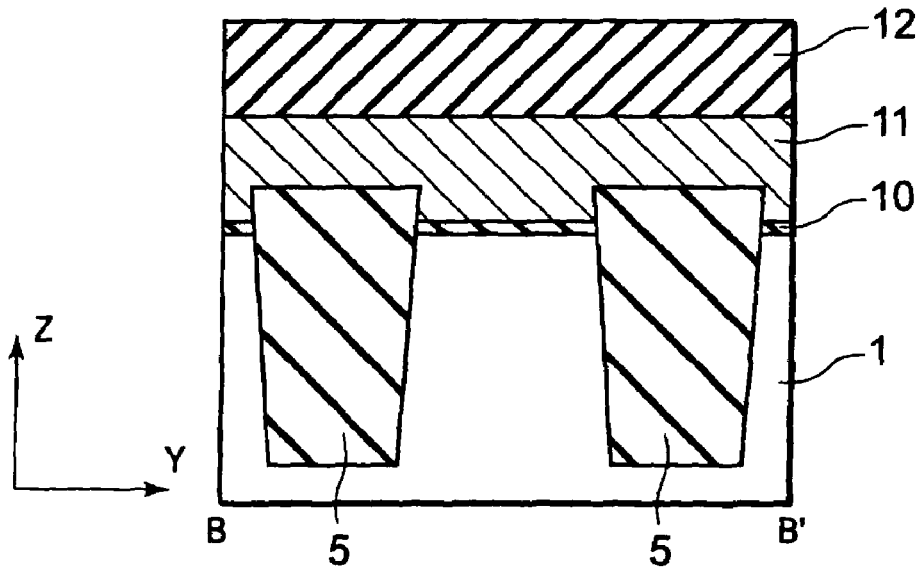
FIG. 26 is a pictorial diagram showing a manufacturing process for the second exemplary embodiment.
Figure 27:
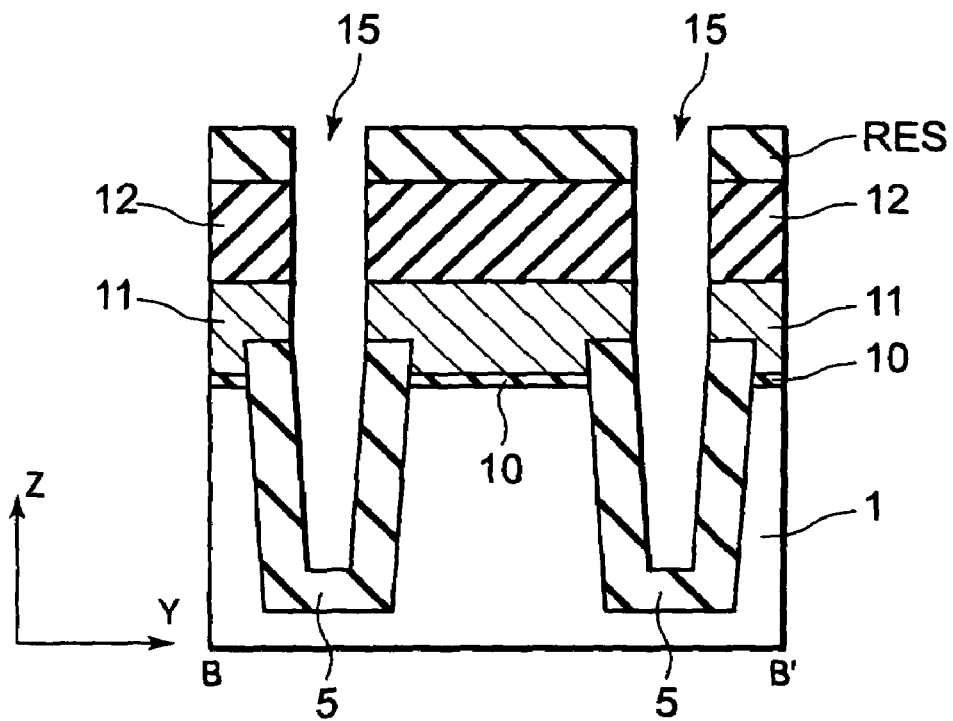
FIG. 27 is a pictorial diagram showing a manufacturing process for the second exemplary embodiment.

FIG. 26 shows a B-B' cross sectional structure in the manufacturing process equivalent to that already shown in FIG. 4. After forming the structure shown in FIG. 4, a comparatively thick insulation film 12 is formed on the FG material film 11. A trench 15 (FG slit), such as that shown in FIG. 27, is formed by the same method as in the first exemplary embodiment (See FIG. 5). A portion of the insulation film 12, FG material film 11 and the STI structure 5 are etched by utilizing a resist mask RES containing the specified pattern, to form the trench 15. The tunnel insulation film 20, erase gate EG, and the protective insulation film 25 are then formed the same as in the first exemplary embodiment (See FIG. 6-FIG. 8).

Figure 28:
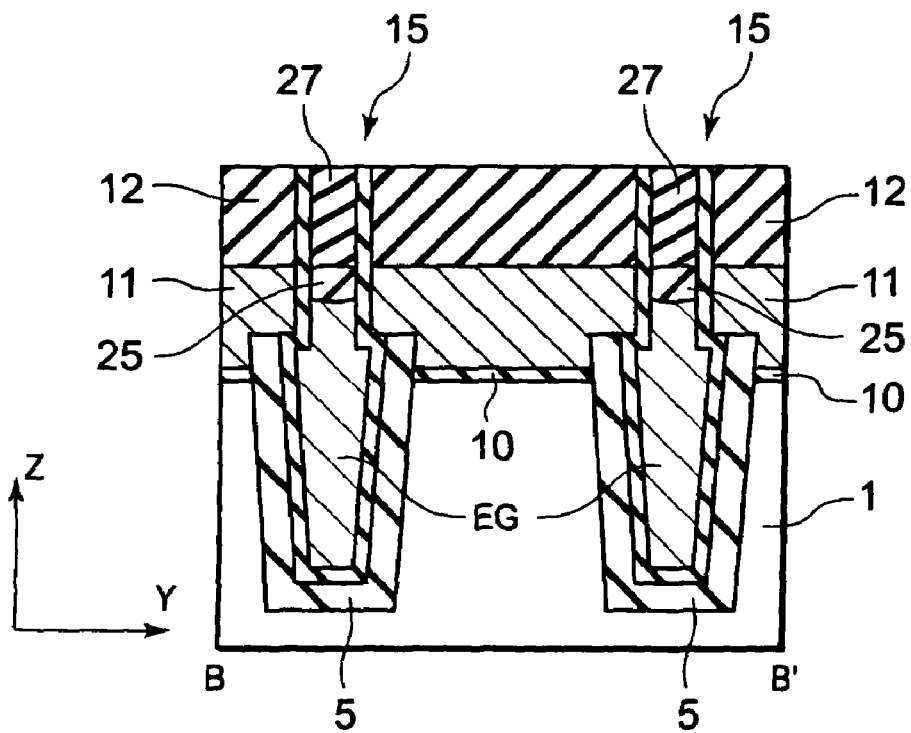
FIG. 28 is a pictorial diagram showing a manufacturing process for the second exemplary embodiment.
Figure 29:
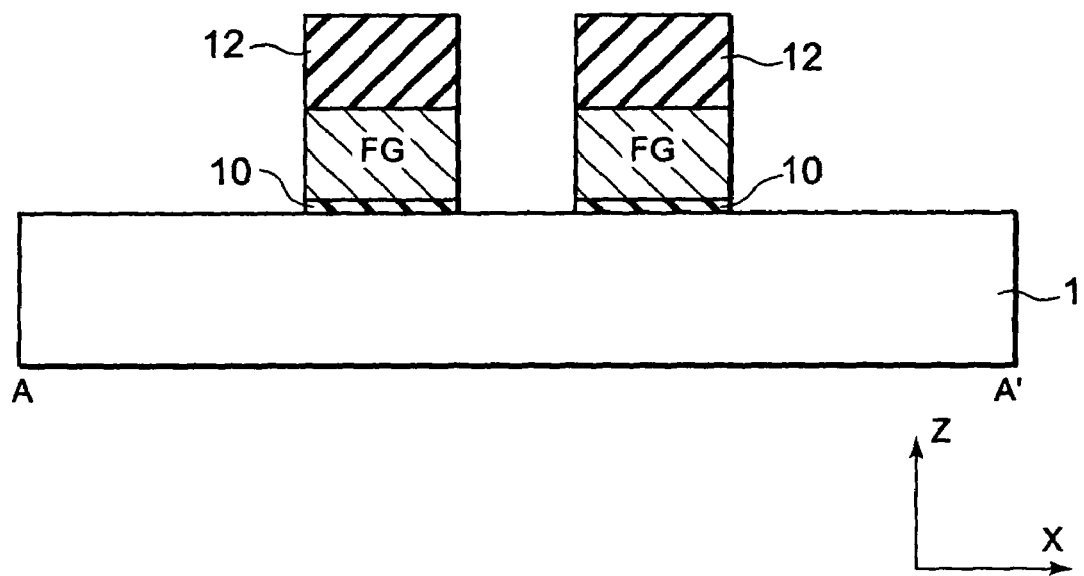
FIG. 29 is a pictorial diagram showing a manufacturing process for the second exemplary embodiment.

Next, after depositing an insulation film 27 by the CVD method across the entire surface, etch back is performed. Consequently, the insulation film 27 is embedded in the remaining region of the slit 15, as shown in FIG. 28. The manufacturing process then proceeds to the gate process, without forming deposits of the insulation film 30 and the PG material film 31 such as shown in FIG. 9 in the first exemplary embodiment. FIG. 29 shows the A-A' cross sectional structure in the manufacturing process equivalent to that already described using FIG. 10. The insulation film 12, the FG material film 11, and the first gate insulation film 10 are etched, as shown in FIG. 29, by utilizing the specified resist mask. The insulation film 27 shown in FIG. 28 can also be removed at this time by selectively adjusting the etching conditions. The floating gate FG is formed by patterning the FG material film 11.

The remainder of the manufacturing process is the same as the first exemplary embodiment. The first diffusion region 50 however is formed with a large overlap on the floating gate FG. First diffusion region 50 is utilized in this exemplary embodiment, instead of the program gate PG. During data read and data programming, the voltage potential on the floating gate rises due to the capacitive coupling between the floating gate FG and the first diffusion region 50.

The erase gate EG characteristics and data erase operation are the same as those in the first exemplary embodiment. Consequently, the same effect is obtained as in the first exemplary embodiment.

Although the invention has been described above in connection with several exemplary embodiments thereof, it will be appreciated by those skilled in the art that those embodiments are provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

It is apparent to one skilled in the art that the present invention may be changed or modified without departing from the spirit and scope of the apparatus claims that are indicated in the subsequent pages as well as methods that are indicated below.

AA. A method for manufacturing a nonvolatile semiconductor memory device, comprising:
  forming a device isolation structure in a semiconductor substrate;
  forming a first gate material film over an entire surface of the device isolation structure;
  forming a trench penetrating through the first gate material and reaching an interior of the device isolation structure;
  forming a tunnel insulation film on an inner wall of the trench;
  forming an erase gate on the tunnel insulation film so that the erase gate is lower than an upper surface of the first gate material film embedded within the trench;
  patterning at least the first gate material film and forming the floating gate; and
  forming a select gate on the floating gate side of the semiconductor substrate by way of the gate insulation film.

BB. The method according to Method AA,
  wherein the forming of the tunnel insulation film includes:
    etching back the inner wall of the device isolation structure within the trench by performing wet etching; and
    forming the tunnel insulation film on the inner wall of the trench after the wet etching.

CC. The method according to Method AA,
  wherein, in the forming of the device isolation structure, the device isolation structure is formed so as to protrude from a surface of the semiconductor substrate, and
  wherein, in the forming of the erase gate, the erase gate is formed opposite the lower surface edge of the first gate material film to overlap the device isolation structure.

DD. The method according to Method AA,
wherein the forming of the floating gate includes:
forming an insulation film and a second gate material film; and
respectively forming a program gate from the second gate material film, and the floating gate from the first gate material film by patterning the second gate material film and the first gate material film together.

What is claimed is:

1. A nonvolatile semiconductor memory device, comprising:
a semiconductor substrate;
a select gate formed above the semiconductor substrate;
a floating gate formed above the semiconductor substrate; and
an erase gate being adjacent to an edge of a lower surface of the floating gate, an upper surface of the erase gate being positioned lower than an upper surface of the floating gate.

2. The nonvolatile semiconductor memory device according to claim 1, wherein the floating gate is formed at a position corresponding to a lateral side of the select gate.

3. The nonvolatile semiconductor memory device according to claim 1, wherein at least a portion of the erase gate is formed lower than an upper surface of the semiconductor substrate.

4. The nonvolatile semiconductor memory device according to claim 1, further comprising:
a device isolation structure formed on the semiconductor substrate,
wherein at least a portion of the erase gate is embedded within the device isolation structure.

5. The nonvolatile semiconductor memory device according to claim 1, wherein the erase gate includes a cavity located adjacent to the edge of the lower surface of the floating gate.

6. The nonvolatile semiconductor memory device according to claim 1, further comprising:
a device isolation structure formed to protrude from a surface of the semiconductor substrate;
a trench formed within the device isolation structure; and
a tunnel insulation film formed on an inner wall of the trench,
wherein the erase gate is formed above the tunnel insulation film so as to be embedded within the trench.

7. The nonvolatile semiconductor memory device according to claim 6, wherein the floating gate includes:
a lower section enclosed between an adjoining device isolation structure; and
an upper section formed on the lower section, and overlapping a portion of the device isolation structure, and
wherein the erase gate is located adjacent to an edge of a lower surface of the upper section via the tunnel insulation film.

8. The nonvolatile semiconductor memory device according to claim 7, wherein the erase gate comprises a cavity located adjacent to the edge of the lower surface of the upper section.

9. The nonvolatile semiconductor memory device according to claim 1, further comprising:
a program gate formed, via an insulation layer, above the floating gate.

10. The nonvolatile semiconductor memory device according to claim 9, further comprising:
a silicide film formed above an upper surface of the program gate.

11. The nonvolatile semiconductor memory device according to claim 1, further comprising:
a gate insulation film formed above a channel region of a surface of the semiconductor substrate;
a first diffusion region and a second diffusion region formed on the semiconductor substrate so as to enclose the channel region;
a plug coupled to the first diffusion region;
a first silicide film formed above an upper surface of the plug; and
a second silicide film formed above a surface of the second diffusion region.

12. The nonvolatile semiconductor memory device according to claim 1, wherein electrons within the floating gate are extracted to the erase gate by a Fowler-Nordheim (FN) tunneling method.

13. The nonvolatile semiconductor memory device according to claim 1, wherein the upper surface of the erase gate is positioned higher than the lower surface of the floating gate.

14. The nonvolatile semiconductor memory device according to claim 1, further comprising:
a silicide film formed above the upper surface of the floating gate.

15. The nonvolatile semiconductor memory device according to claim 1, further comprising:
a silicide film disposed on an upper surface of the select gate.

16. The nonvolatile semiconductor memory device according to claim 1, wherein a lower surface of the erase gate is positioned lower than the lower surface of the floating gate.

17. A nonvolatile semiconductor memory device, comprising:
a semiconductor substrate;
a select gate formed above the semiconductor substrate;
a floating gate formed above the semiconductor substrate on a side of the select gate;
a device isolation structure formed on the semiconductor substrate; and
an erase gate formed on the device isolation structure,
wherein the erase gate is positioned lower than an upper surface of the floating gate, and adjacent to an edge of a lower surface of the floating gate.

18. The nonvolatile semiconductor memory device according to claim 17, further comprising:
a program gate formed above the floating gate;
a first diffusion region formed on the semiconductor substrate at a position adjacent to the floating gate;
a second diffusion region formed on the semiconductor substrate at a position adjacent to the select gate;
a plug formed above the first diffusion region, and coupled to the first diffusion region;
a first silicide film formed on an upper surface of the program gate;
a second silicide film formed on a surface of the plug;
a third silicide film formed on a surface of the select gate; and
a fourth silicide film formed on a surface of the second diffusion region.

19. The nonvolatile semiconductor memory device according to claim 17, wherein an upper surface of the erase gate is positioned lower than the upper surface of the floating gate.

20. The nonvolatile semiconductor memory device according to claim 19, wherein the upper surface of the erase gate is positioned higher than the lower surface of the floating gate.

21. A nonvolatile semiconductor memory device, comprising: a semiconductor substrate; and a memory cell array with a plurality of memory cells formed on the semiconductor substrate, wherein each of the plurality of memory cells includes: a select gate formed above the semiconductor substrate; a floating gate formed above the semiconductor substrate; and an erase gate being adjacent to an edge of a lower surface of the floating gate, an upper surface of the erase gate being positioned lower than an upper surface of the floating gate, and wherein the erase gate is jointly formed with a specified number of memory cells arrayed along a predetermined direction among the plurality of memory cells.

22. The nonvolatile semiconductor memory device according to claim 21, wherein, in each of the plurality of memory cells, the floating gate is formed at a position corresponding to a lateral side of the select gate.

* * * * *